(12) United States Patent
Mallela et al.

(10) Patent No.: US 9,859,384 B2
(45) Date of Patent: Jan. 2, 2018

(54) VERTICAL FIELD EFFECT TRANSISTORS WITH METALLIC SOURCE/DRAIN REGIONS

(71) Applicant: International Business Machines Corporation, Armonk, NY (US)

(72) Inventors: Hari V. Mallela, Poughquag, NY (US); Robert R. Robison, Colchester, VT (US); Reinaldo Vega, Mahopac, NY (US); Rajasekhar Venigalla, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/431,807

(22) Filed: Feb. 14, 2017

(65) Prior Publication Data

US 2017/0317177 A1 Nov. 2, 2017

Related U.S. Application Data

(63) Continuation of application No. 15/140,763, filed on Apr. 28, 2016, now Pat. No. 9,728,466.

(51) Int. Cl.
*H01L 21/00* (2006.01)
*H01L 21/338* (2006.01)
(Continued)

(52) U.S. Cl.
CPC ...... *H01L 29/41741* (2013.01); *H01L 23/485* (2013.01); *H01L 29/41791* (2013.01); *H01L 29/785* (2013.01); *H01L 29/7827* (2013.01)

(58) Field of Classification Search
CPC ............ H01L 29/66795; H01L 29/785; H01L 29/66666; H01L 29/7827; H01L 29/78642; H01L 29/7926
(Continued)

(56) References Cited

U.S. PATENT DOCUMENTS 7,838,875 B1 11/2010 Tsang
2005/0285183 A1 12/2005 Baik
(Continued)

FOREIGN PATENT DOCUMENTS

CN 104347708 A 2/2015
CN 105140285 A 12/2015
(Continued)

OTHER PUBLICATIONS

English translation for Taiwan Application No. TW201546909A.
(Continued)

*Primary Examiner* — Hsien Ming Lee
(74) *Attorney, Agent, or Firm* — Vazken Alexanian; Ryan, Mason & Lewis, LLP

(57) ABSTRACT

Semiconductor devices having vertical FET (field effect transistor) devices with metallic source/drain regions are provided, as well as methods for fabricating such vertical FET devices. For example, a semiconductor device includes a first source/drain region formed on a semiconductor substrate, a vertical semiconductor fin formed on the first source/drain region, a second source/drain region formed on an upper surface of the vertical semiconductor fin, a gate structure formed on a sidewall surface of the vertical semiconductor fin, and an insulating material that encapsulates the vertical semiconductor fin and the gate structure. The first source/drain region comprises a metallic layer and at least a first epitaxial semiconductor layer. For example, the metallic layer of the first source/drain region comprises a metal-semiconductor alloy such as silicide.

14 Claims, 26 Drawing Sheets

(51) Int. Cl.
   *H01L 21/337*   (2006.01)
   *H01L 21/8238*  (2006.01)
   *H01L 21/336*   (2006.01)
   *H01L 29/80*    (2006.01)
   *H01L 29/94*    (2006.01)
   *H01L 29/417*   (2006.01)
   *H01L 29/78*    (2006.01)
   *H01L 23/485*   (2006.01)

(58) Field of Classification Search
   USPC ....... 438/138, 156, 164, 173, 192, 212, 268; 257/263, 302
   See application file for complete search history.

(56) References Cited

U.S. PATENT DOCUMENTS

2007/0148939 A1   6/2007   Chu et al.
   2008/0054300 A1   3/2008   Nikkel et al.
   2014/0035059 A1   2/2014   Giles et al.

FOREIGN PATENT DOCUMENTS

KR   1020050097632 A   10/2005
   TW        201546909 A   12/2015
   WO       2013095349 A1   6/2013

OTHER PUBLICATIONS

English translation for China Application No. CN105140285A.
English translation for China Application No. CN104347708A.
English translation for Korean Application No. KR1020050097632A.
List of IBM Patents or Patent Applications Treated as Related.

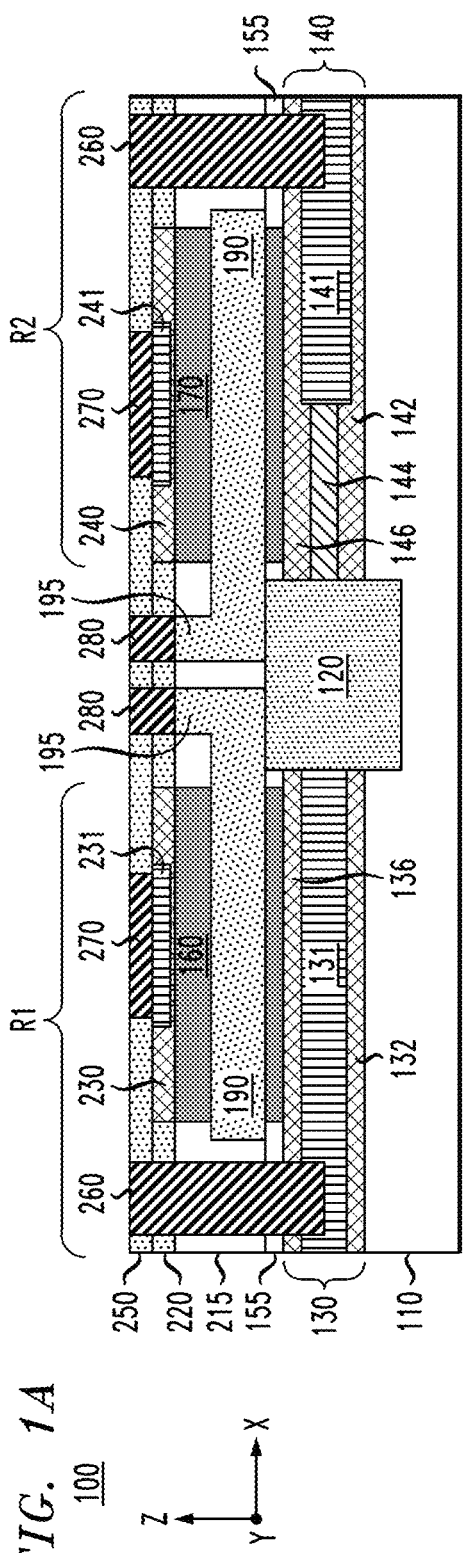
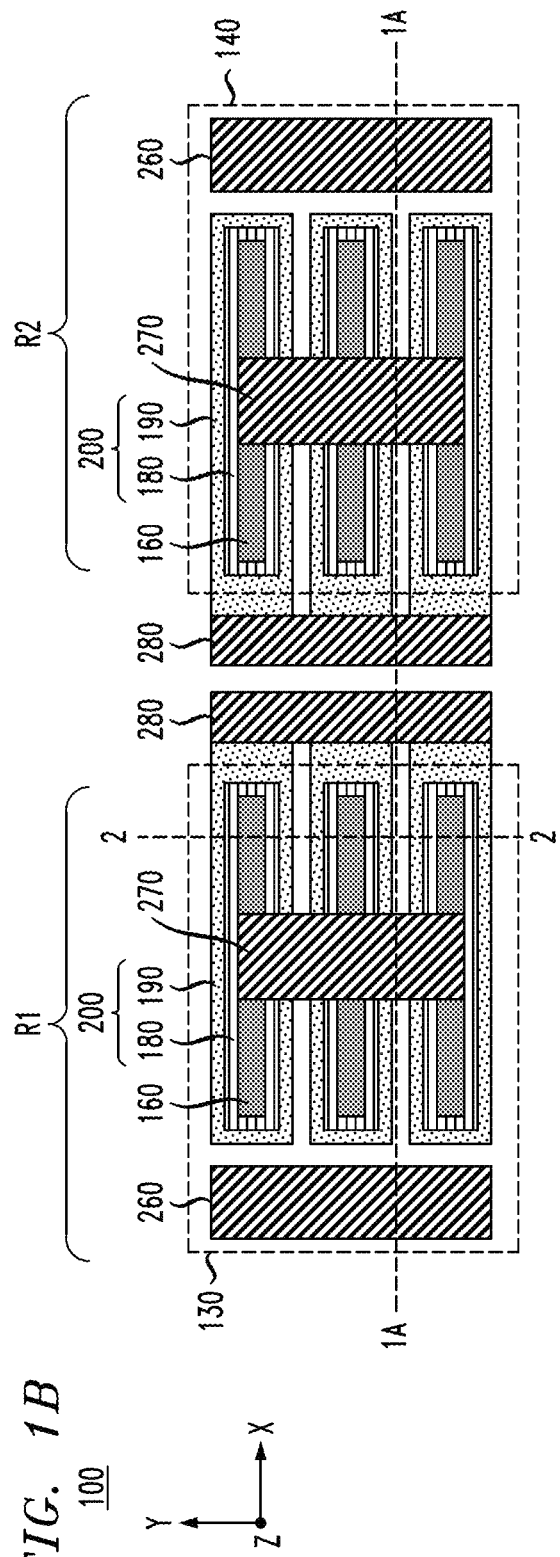
FIG. 1A
FIG. 1B

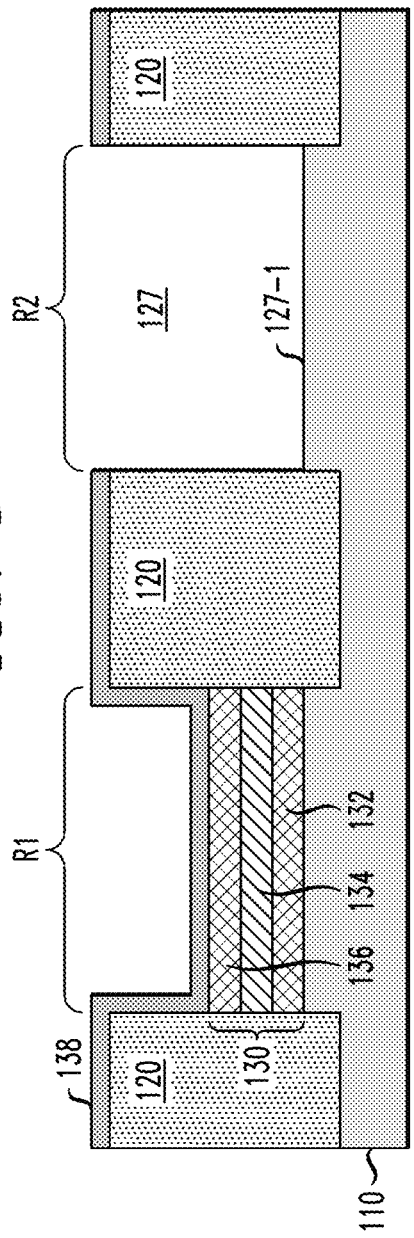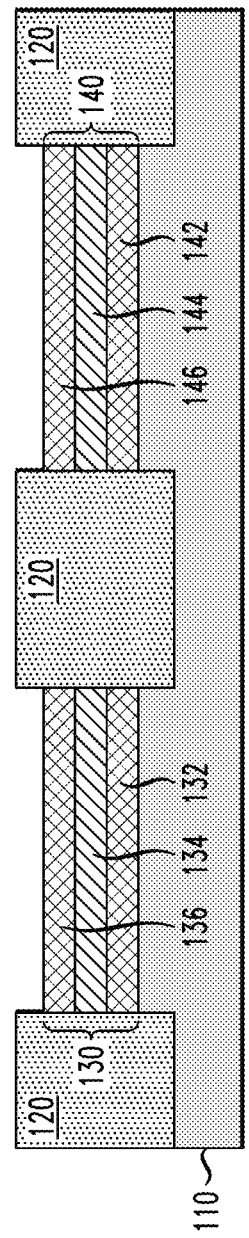

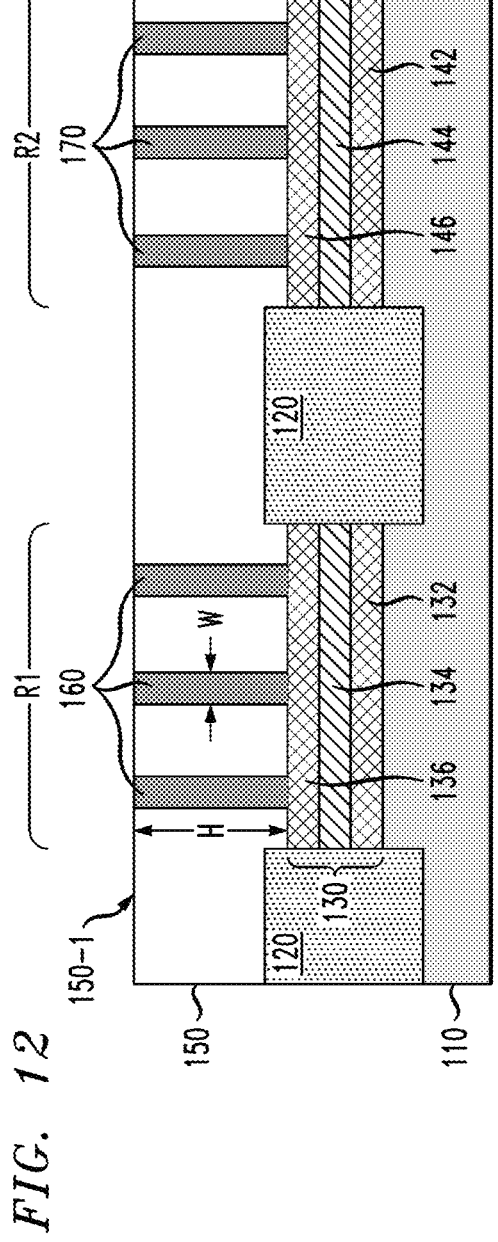
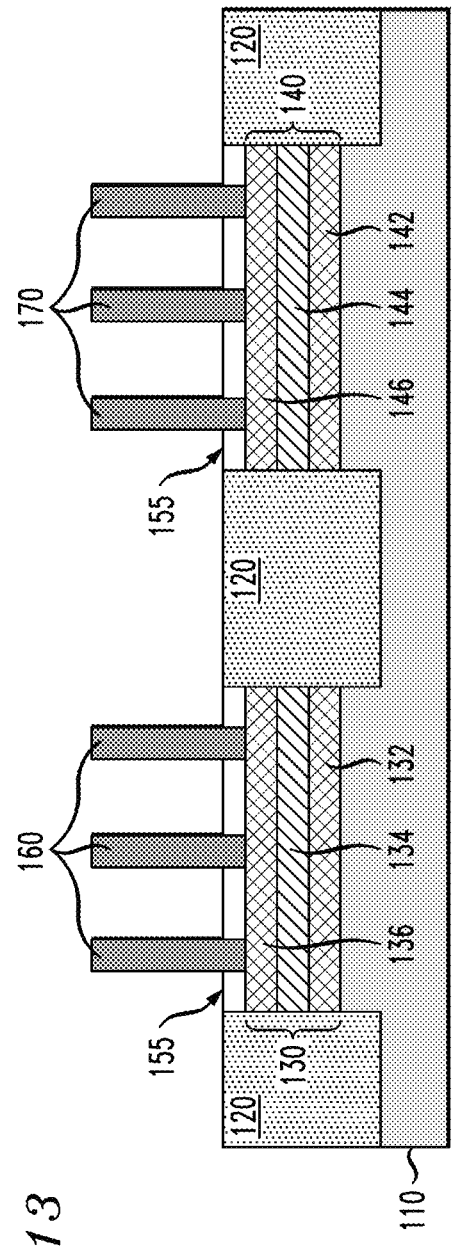
FIG. 12
FIG. 13

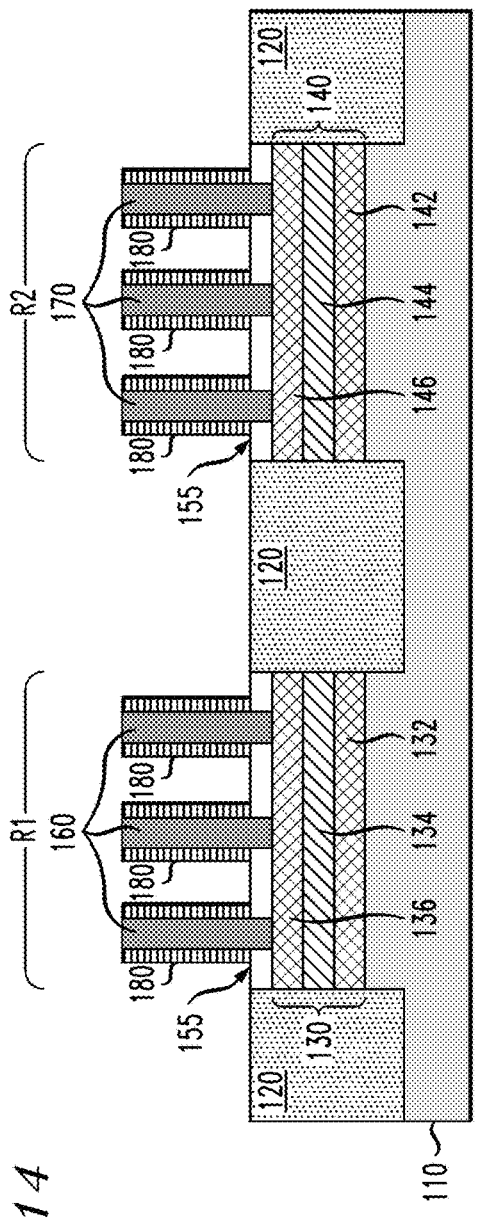
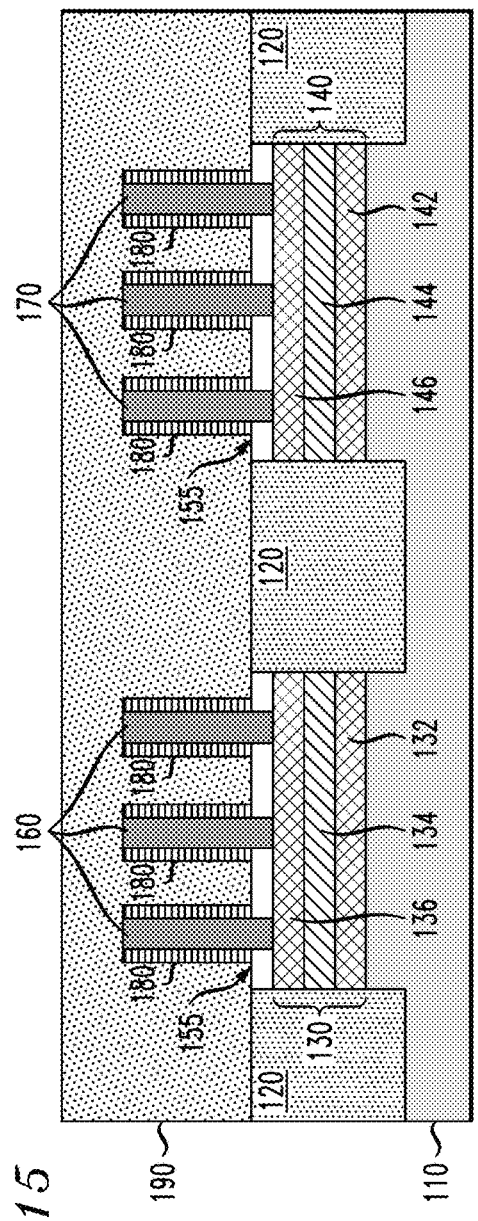

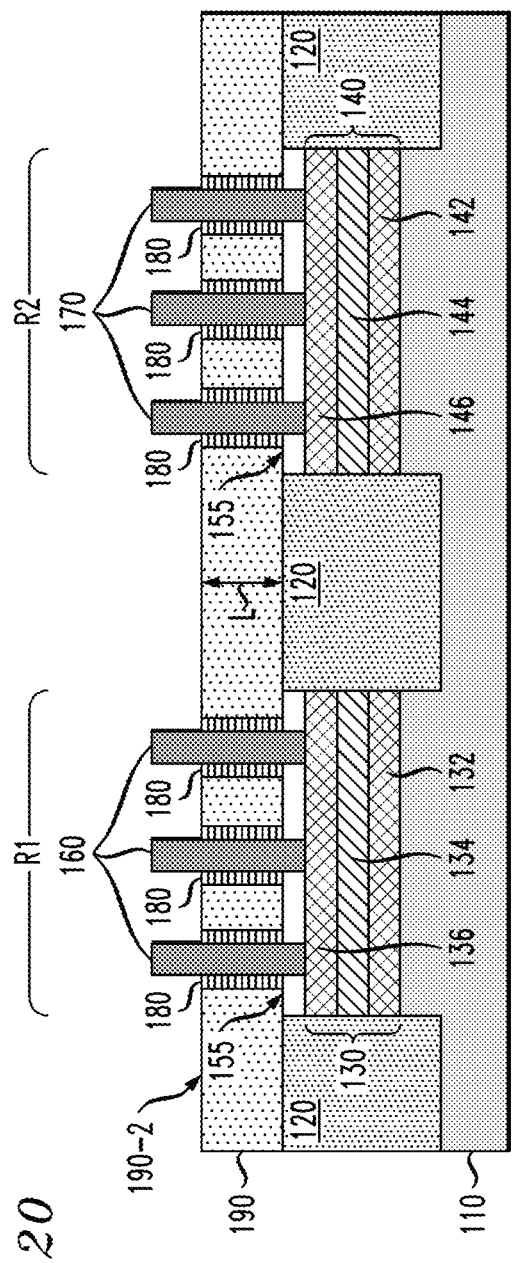
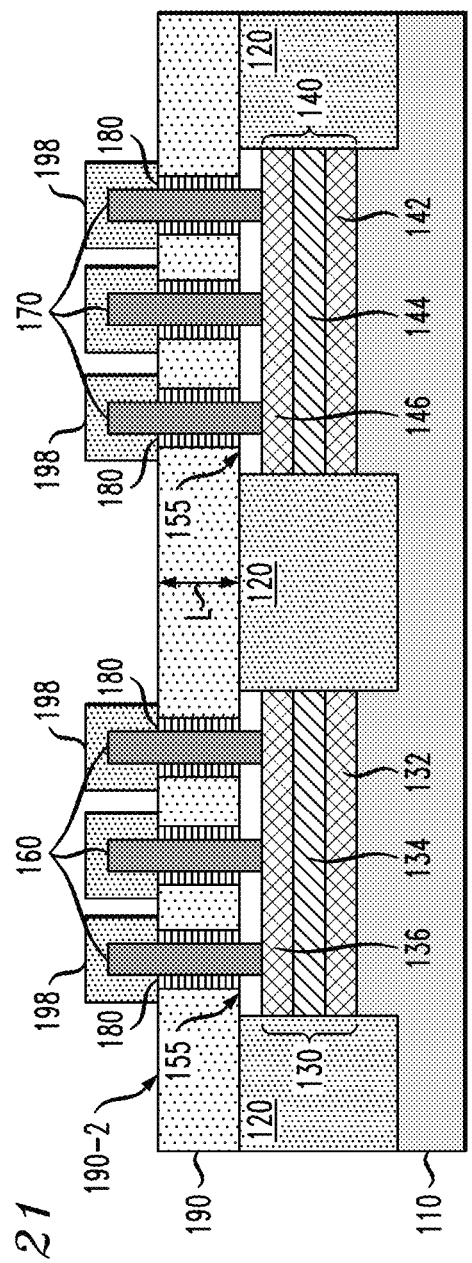
FIG. 20
FIG. 21

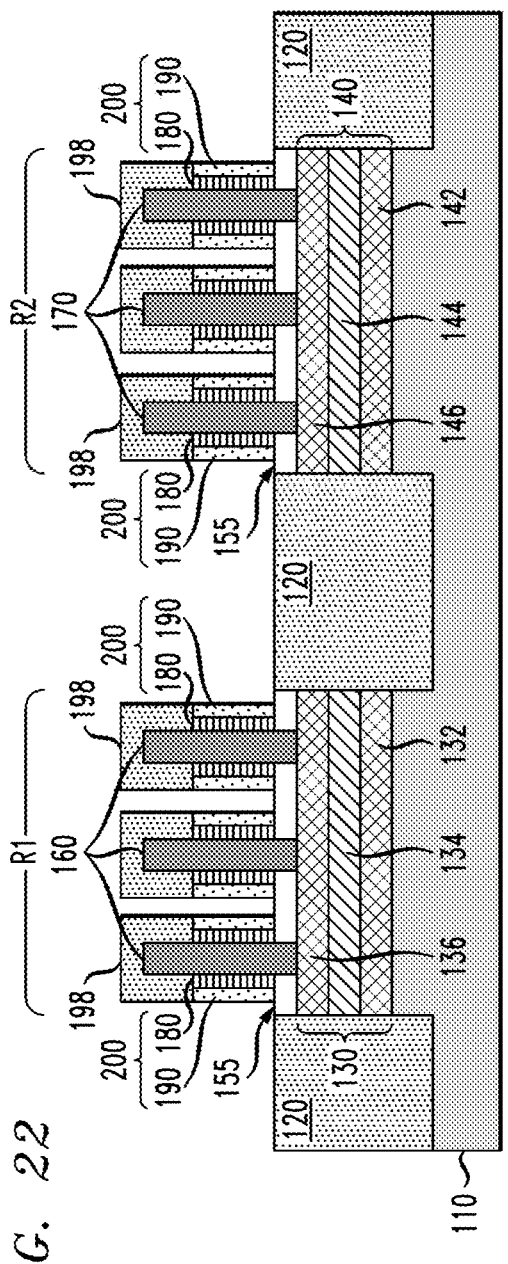
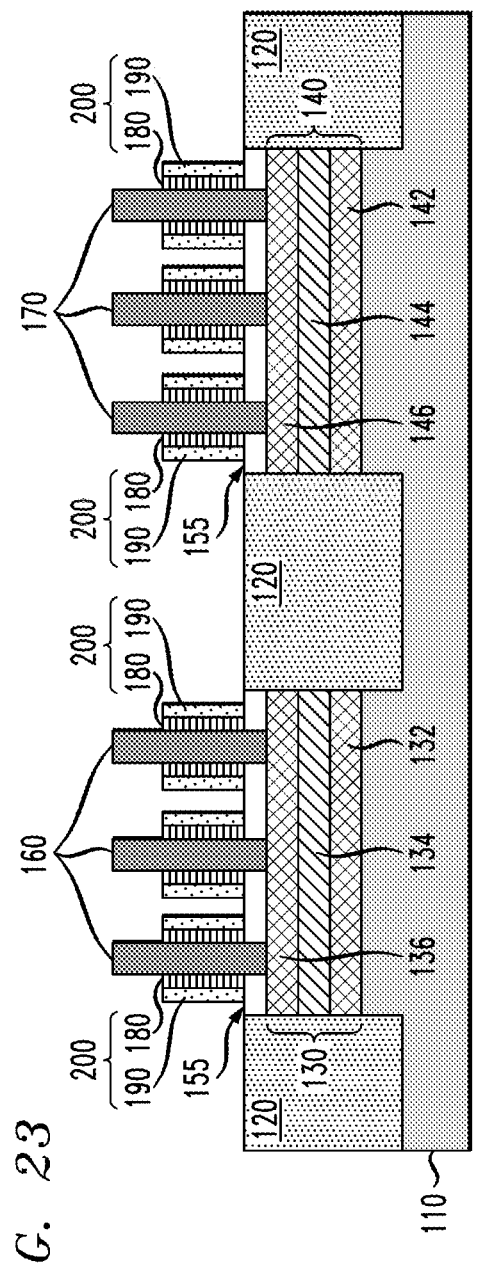
FIG. 22
FIG. 23

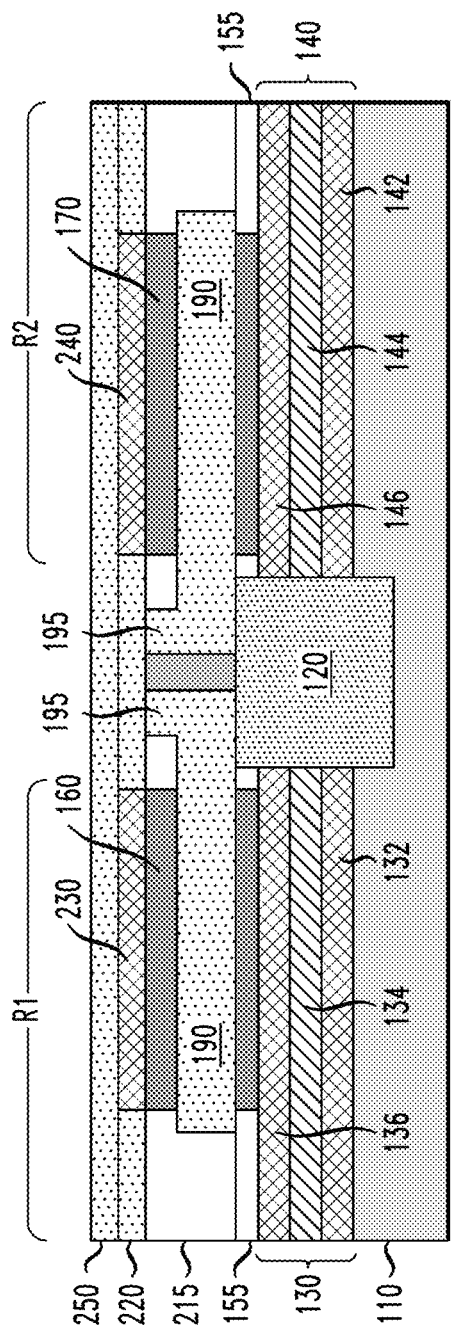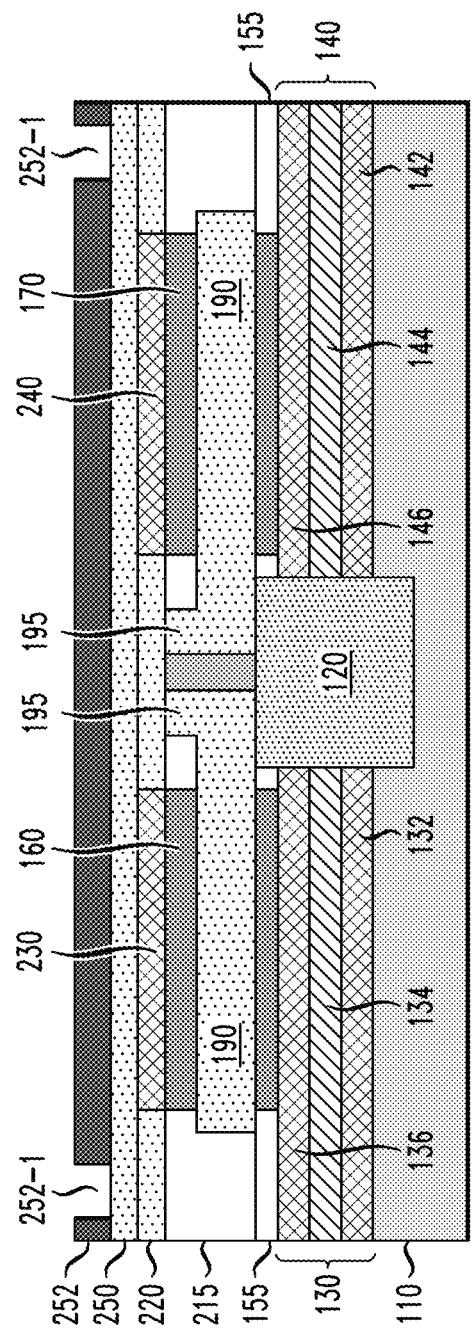
FIG. 33
FIG. 34

VERTICAL FIELD EFFECT TRANSISTORS WITH METALLIC SOURCE/DRAIN REGIONS

TECHNICAL FIELD

This disclosure relates generally to semiconductor fabrication techniques and, in particular, to structures and methods for fabricating vertical FET (field effect transistor) devices.

BACKGROUND

Traditional CMOS (complementary metal oxide semiconductor) techniques include process flows for constructing planar FET devices. With planar FETs, increased transistor density can be achieved by decreasing the pitch between transistor gate elements. However, with planar FET devices, the ability to decrease gate pitch is limited by the required gate length, spacer thickness, and source/drain size. In recent years, there has been significant research and development with regard to vertical FET devices, which decouple the gate length from the gate pitch requirement and enable scaling of transistor density. In general, vertical FET devices are designed to have gate structures that are formed on multiple sides of a vertical channel structure (e.g., a vertical semiconductor fin or vertical nanowire). With vertical FET devices, scaling is determined by how closely conductive contacts to source and drain regions can be placed.

In general, vertical FET devices employ doped source and drain regions, wherein a doped source region for a vertical FET can be formed on top of a vertical semiconductor fin, and wherein a doped drain region can be formed underneath the vertical semiconductor fin. In addition, a vertical drain contact of the vertical FET device is disposed adjacent to the vertical semiconductor fin as an elongated bar contact. The vertical drain contact is formed to make contact to an upper surface of the underlying drain region, and is disposed at a sufficient distance from the vertical semiconductor fin so that the vertical drain contact does not electrically short to the vertical metal gate structure formed on the vertical semiconductor fin. What this effectively means is that the current path through the doped drain region between the vertical drain contact/drain region interface and the drain region/channel junction interface, is comprised entirely of doped semiconductor material. This current path through the doped drain region, if relatively long, can result in increased series resistance of the drain, which in turn reduces a total drive current of the vertical FET device. Furthermore, if the vertical FET channel width is large (which, for a vertical FET, means patterning a long semiconductor fin), then the total drain resistance is high toward an opposite end of the semiconductor fin which is not adjacent to the vertical drain contact. This results in a voltage drop across the device width and, therefore, a Vds non-uniformity across the device width, with Vds being smaller at the opposite end of the semiconductor fin as compared to the Vds at the end of the semiconductor fin adjacent to the drain contact, which also reduces a total drive current of the vertical FET device.

SUMMARY

Embodiments of the invention generally include semiconductor devices having vertical FET devices with metallic source/drain regions, and methods for fabricating vertical FET devices with metallic source/drain regions.

For example, one embodiment of the invention includes a semiconductor device which comprises a first source/drain region formed on a semiconductor substrate, a vertical semiconductor fin formed on the first source/drain region, a second source/drain region formed on an upper surface of the vertical semiconductor fin, a gate structure formed on a sidewall surface of the vertical semiconductor fin, and an insulating material encapsulating the vertical semiconductor fin and the gate structure. The first source/drain region comprises a metallic layer and at least a first epitaxial semiconductor layer. In one embodiment, the metallic layer of the first source/drain region comprises a metal-semiconductor alloy such as a silicide.

Another embodiment includes a method for fabricating a semiconductor device. The method includes: forming a first source/drain region on a semiconductor substrate, wherein the first source/drain region comprises a first epitaxial semiconductor layer and a sacrificial epitaxial semiconductor layer; forming a vertical semiconductor fin on the first source/drain region; forming a gate structure on a sidewall surface of the vertical semiconductor fin; encapsulating the vertical semiconductor fin and the gate structure in insulating material; forming a second source/drain region on an upper surface of the vertical semiconductor fin; forming an opening through the insulating material and into the first source/drain region to expose the sacrificial epitaxial semiconductor layer of the first source/drain region; removing at least a portion of the sacrificial epitaxial semiconductor layer through the opening in the insulating material to form a void in the first source/drain region; filling the void in the first source/drain region with a metallic layer; and filling the opening with a conductive material to form a first vertical contact to the metallic layer of the first source/drain region.

In another embodiment, the void in the first source/drain region is filled with a metallic layer using a method which includes depositing a layer of metallic material to fill the void with the metallic material, performing a thermal anneal process to induce a reaction between the metallic material in the void and epitaxial semiconductor material of the first epitaxial semiconductor layer to form a metal-semiconductor alloy region within the first source/drain region, and removing unreacted portions of the layer of metallic material. In one embodiment, the metal-semiconductor alloy region comprises a silicide.

Other embodiments will be described in the following detailed description of embodiments, which is to be read in conjunction with the accompanying figures.

BRIEF DESCRIPTION OF THE DRAWINGS

FIGS. 1A and 1B are schematic views of a semiconductor device having vertical field effect transistors with a metallic source/drain region, according to an embodiment of the invention.

FIGS. 2 through 42 schematically illustrate a method for fabricating the semiconductor device of FIGS. 1A/1B, according to an embodiment of the invention, wherein:

FIG. 2 is a cross-sectional view of a semiconductor structure at an initial stage of fabrication starting with a silicon nitride layer formed on a surface of a semiconductor substrate;

FIG. 3 is a schematic cross-sectional side view of the semiconductor structure of FIG. 2 after patterning the silicon nitride layer to form an etch mask comprising openings that define isolation regions to be formed in a surface of the semiconductor substrate;

FIG. 4 is a schematic cross-sectional side view of the semiconductor structure of FIG. 3 after etching portions of the semiconductor substrate to form a pattern of trenches in the surface of the substrate;

FIG. 5 is schematic cross-sectional side view of the semiconductor structure of FIG. 4 after filling the trenches with insulating/dielectric material to form shallow trench isolation (STI) regions;

FIG. 6 is a schematic cross-sectional side view of the semiconductor structure of FIG. 5 after forming a recess within a first device region defined by surrounding STI regions;

FIG. 7 is a schematic cross-sectional side view of the semiconductor structure of FIG. 6 after forming a drain region on a bottom of the recess within the first device region and forming a hardmask layer over the semiconductor structure;

FIG. 8 is a schematic cross-sectional side view of the semiconductor structure of FIG. 7 after forming a recess within a second device region defined by the surrounding STI regions;

FIG. 9 is a schematic cross-sectional side view of the semiconductor structure of FIG. 8 after forming a drain region on the bottom of the recess within the second device region and recessing the STI regions;

FIG. 10 is a schematic cross-sectional side view of the semiconductor structure of FIG. 9 after depositing and planarizing a layer of insulating material over the semiconductor structure;

FIG. 11 is a schematic cross-sectional side view of the semiconductor structure of FIG. 10 after patterning the layer of insulating material to form trenches through the layer of insulating material within the first and second device regions;

FIG. 12 is a cross-sectional schematic view of the semiconductor structure of FIG. 11 after filling the trenches with epitaxial semiconductor material to foul' vertical semiconductor fins in the first and second device regions;

FIG. 13 is a schematic cross-sectional side view of the semiconductor structure of FIG. 12 after recessing the layer of insulating material to form a bottom spacer in the first and second device regions;

FIG. 14 is a schematic cross-sectional side view of the semiconductor structure of FIG. 13 after forming a gate stack structure on the exposed sidewalls of the vertical semiconductor fins within the first and second device regions;

FIG. 15 is a schematic cross-sectional side view of the semiconductor structure of FIG. 14 after depositing a layer of gate electrode material;

FIG. 16 is a schematic cross-sectional side view of the semiconductor structure of FIG. 15 after planarizing the layer of gate electrode material down to an upper surface of the vertical semiconductor fins;

FIG. 18 is a schematic top view of another embodiment of a device region in which two vertical semiconductor fins are formed end-to-end and a gate contact region disposed between the ends of the vertical semiconductor fins;

FIG. 19 is a schematic top view of another embodiment of a device region in which two vertical semiconductor fins are formed side by side, and end-to-end with at least one other semiconductor fin, and a gate contact region disposed between the ends of the vertical semiconductor fins;

FIG. 20 is a schematic cross-sectional side view of the semiconductor structure of FIG. 17A after recessing the exposed portions of the gate stack structures on the sidewalls of the vertical semiconductor fins down to the recessed surface of the gate electrode material;

FIG. 21 is a schematic cross-sectional side view of the semiconductor structure of FIG. 20 after forming disposable spacers that encapsulate the exposed portions of the vertical semiconductor fins;

FIG. 22 is a schematic cross-sectional side view of the semiconductor structure of FIG. 21 after using the disposable spacers as an etch mask to etch the exposed portions of the gate electrode material to form metallic gate structures on the vertical semiconductor fins;

FIG. 23 is a schematic cross-sectional side view of the semiconductor structure of FIG. 22 after removing the disposable spacers;

FIG. 24 is a schematic cross-sectional side view of the semiconductor structure of FIG. 23 after depositing a layer of insulating spacer material and planarizing the layer of insulating spacer material down to the upper surface of the vertical semiconductor fins;

FIG. 25 is a schematic cross-sectional side view of the semiconductor structure of FIG. 24 after recessing the layer of insulating spacer material to a level that is below an upper surface of the vertical semiconductor fins and above the metallic gate structures;

FIG. 26 is a schematic cross-sectional side view of the semiconductor structure of FIG. 25 after forming an ILD (inter-level dielectric layer) over the upper insulating spacer and forming a first hardmask layer over the ILD layer;

FIG. 27 is a schematic cross-sectional side view of the semiconductor structure of FIG. 26 after patterning the hardmask layer to expose portions of the ILD layer in the first device region, and etching down the upper portions of the vertical semiconductor fins to form openings in the ILD layer;

FIG. 28 is a schematic cross-sectional side view of the semiconductor structure of FIG. 27 after forming source regions on top of the vertical semiconductor fins in the first device region;

FIG. 29 is a schematic cross-sectional side view of the semiconductor structure of FIG. 28 after removing the first hardmask layer, forming a second hardmask layer over the ILD layer, and patterning the second hardmask layer to expose portions of the ILD layer in the second device region;

FIG. 30 is a schematic cross-sectional side view of the semiconductor structure of FIG. 29 after etching down the upper portions of the vertical semiconductor fins to form openings in the ILD layer;

FIG. 31 is a schematic cross-sectional side view of the semiconductor structure of FIG. 30 after forming source regions on top of the vertical semiconductor fins in the second device region;

FIG. 33 is a schematic cross-sectional side view of the semiconductor structure of FIG. 32B after forming a capping layer over the ILD layer;

FIG. 34 is a schematic cross-sectional side view of the semiconductor structure of FIG. 33 after depositing and patterning an etch hardmask for etching openings for drain contacts;

FIG. 35 is a schematic cross-sectional side view of the semiconductor structure of FIG. 34 after etching openings to expose the sacrificial epitaxial semiconductor layers of the drain regions;

FIG. 36 is a schematic cross-sectional side view of the semiconductor structure of FIG. 35 after removing the entire sacrificial epitaxial semiconductor layer of the drain region in the first device region and removing a portion of the sacrificial epitaxial semiconductor layer of the drain region in the second device region, thereby forming voids in the drain regions;

FIG. 37 is a schematic cross-sectional side view of the semiconductor structure of FIG. 36 after depositing a layer of metallic material to fill the voids in the drain regions with the metallic material;

FIG. 38 is a schematic cross-sectional side view of the semiconductor structure of FIG. 37 after performing a thermal anneal process to form metal-semiconductor alloy regions within the drain regions using the metallic material;

FIG. 39 is a schematic cross-sectional side view of the semiconductor structure of FIG. 38 after removing the unreacted portions of the layer of metallic material following the thermal anneal process;

FIG. 40 is a schematic cross-sectional side view of the semiconductor structure of FIG. 39 after forming drain contacts to the metal-semiconductor alloy regions and removing the etch hardmask;

FIG. 41 is a schematic cross-sectional side view of the semiconductor structure of FIG. 40 after forming metal-semiconductor alloy regions on the source regions; and FIG. 42 is a schematic cross-sectional side view of the semiconductor structure of FIG. 41 after forming source contacts to the metal-semiconductor alloy regions of the source regions.

DETAILED DESCRIPTION OF EMBODIMENTS

Figure 2:
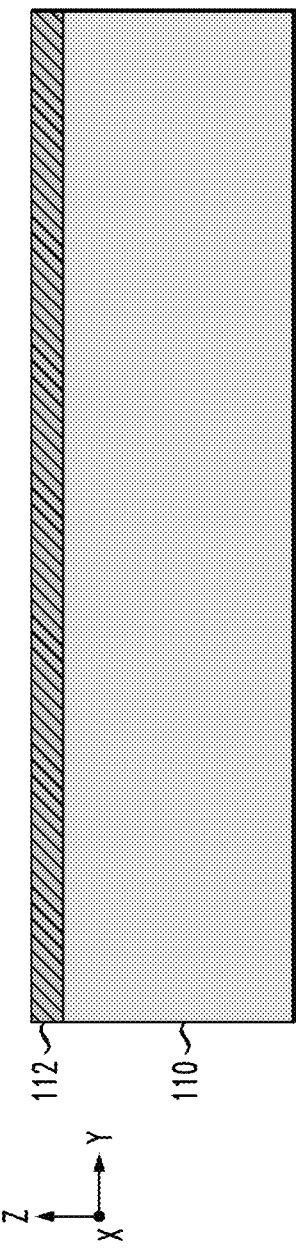

Embodiments of the invention will now be described in further detail with regard to semiconductor devices having vertical FET devices with metallic source/drain regions, as well as methods for fabricating vertical FET devices with metallic source/drain regions. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

FIGS. 1A and 1B are schematic views of a semiconductor device 100 having vertical FET devices with metallic source/drain regions, according to an embodiment of the invention. FIG. 1A is a schematic side view of the semiconductor device 100 taken along line 1A-1A in FIG. 1B, and FIG. 1B is a schematic top plan view of the semiconductor device 100 shown in FIG. 1A. More specifically, FIG. 1A is a schematic side view of the semiconductor device 100 in an X-Z plane, and FIG. 1B is a top view showing a layout of various elements within an X-Y plane, as indicated by the respective XYZ Cartesian coordinates shown in FIGS. 1A and 1B. It is to be understood that the term "vertical" or "vertical direction" as used herein denotes a Z-direction of the Cartesian coordinates shown in FIGS. 1A/1B, and the term "horizontal" or "horizontal direction" as used denotes an X-direction and/or Y-direction of the Cartesian coordinates shown in FIGS. 1A/1B.

As collectively shown in FIGS. 1A/1B, the semiconductor device 100 comprises a substrate 110 and a shallow trench isolation (STI) region 120 which defines and isolates a first device region R1 and a second device region R2. The semiconductor device 100 further comprises drain regions 130 and 140, a lower insulating spacer 155, vertical semiconductor fins 160 and 170, metal gate structures 200 (each comprising a gate stack structure 180 and gate electrode 190) disposed around a portion of the sidewalls of the vertical semiconductor fins 160 and 170, an upper insulating spacer 215, an ILD (inter-level dielectric) layer 220, source regions 230 and 240 with respective metal-semiconductor alloy regions 231 and 241, and a capping layer 250. The semiconductor device 100 further comprises vertical drain contacts 260 that connect to respective drain regions 130 and 140, vertical source contacts 270 that connect to the metal-alloy regions 231 and 241 of the respective source regions 230 and 240, and vertical gate contacts 280 that connect to extended portions 195 of the gate electrodes 190.

In the illustrative embodiment of FIGS. 1A and 1B, within the first device region R1, the drain region 130, the lower insulating spacer 155, the vertical semiconductor fins 160 and corresponding metal gate structures 200, the upper insulating spacer 215, and the source regions 230 with the metal-semiconductor alloy regions 231 (formed on top of each of the vertical semiconductor fins 160), form a single vertical FET device in the device region R1. Similarly, within the second device region R2, the drain region 140, the lower insulating spacer 155, the vertical semiconductor fins 170 and corresponding metal gate structures 200, the upper insulating spacer 215, and the source regions 240 with the metal-semiconductor alloy regions 231 (formed on top of each of the vertical semiconductor fins 160), form a single vertical FET device in the device region R2. For illustrative purposes, it is assumed that a vertical FET device of a first type (e.g., n-type FET device) is formed in the first device region R1, and that a vertical FET device of a second type (e.g., p-type FET device) is formed in the second device region R2.

As shown in FIG. 1B, the vertical FET device in the first device region R1 comprises a plurality of the vertical semiconductor fins 160 (e.g., three fins) which are each surrounded by a corresponding one of the metal gate structures 200. Similarly, the vertical FET device in the second device region R2 comprises a plurality of the vertical semiconductor fins 170 (e.g., three fins) which are each surrounded by a corresponding one of the metal gate structures 200. Each vertical semiconductor fin 160 comprises a vertical channel segment of the vertical FET within the first device region R1, and each vertical semiconductor fin 170 comprises a vertical channel segment of the vertical FET within the second device region R2.

In one embodiment of the invention, within each device region R1 and R2, the gate electrodes 190 of the metal gate structures 200 are commonly connected at one end which comprises the extended portion 195, wherein the extended portion 195 serves as contact landing for a single gate contact 280. Each gate stack structure 180 (which is disposed between a vertical semiconductor fin 160/170 and a gate electrode 190) comprises a gate dielectric layer formed on the semiconductor fin 160/170, and a work function metal layer formed on the gate dielectric layer. The lower insulating spacers 155 and the upper insulating spacer 215 collectively provide a layer of insulating material which encapsulates the vertical semiconductor fins 160/170 and metal gate structures 200 in insulating material to electrically insulate the vertical semiconductor fins 160/170 and metal gate structures 200 from surrounding components such as the drain contacts 260, the drain regions 130 and 140, and other adjacent metal gate structures 200.

As further shown in FIGS. 1A and 1B, the source regions 230 formed on top of the vertical semiconductor fins 160 of the vertical FET device in the first device region R1 are commonly connected to a single source contact 270, and the source regions 240 of the vertical semiconductor fins 170 of the vertical FET device in the second device region R2 are commonly connected to a single source contact 270. The drain contacts 260 in the first and second device regions R1 and R2 comprise elongated contacts that are disposed adjacent to the ends of the respective vertical semiconductor fins 160 and 170, opposite the gate contacts 280 within the device regions R1 and R2. The drain regions 130 and 140 in the first and second device regions R1 and R2 have footprint areas (as illustrated by the dashed lines in FIG. 1B) which are sized and dimensioned to enable contact with the respective set of vertical semiconductor fins 160 and 170 and the drain contacts 260 in the respective device regions R1 and R2.

In particular, as shown in FIG. 1B, the drain region 130 in the first device region R1 serves as a common drain region for each of the vertical semiconductor fins 160. In addition, the drain region 130 comprises an extended portion which extends past the ends of the vertical semiconductor fins 160 to serve as a contact area for the drain contact 260 within the first device region R1. Similarly, the drain region 140 in the second device region R2 serves as a common drain region for each of the vertical semiconductor fins 170 and comprises an extended portion which extends past the ends of the vertical semiconductor fins 170 to serve as a contact area for the drain contact 260 within the second device region R2.

As further shown in FIG. 1A, the drain region 130 in the first device region R1 comprises a metal-semiconductor alloy region 131 disposed between epitaxial semiconductor layers 132 and 136. Similarly, the drain region 140 in the second device region R2 comprises a metal-semiconductor alloy region 141 disposed between epitaxial semiconductor layers 142 and 146. As explained in further detail below, each drain region 130 and 140 is initially formed as a stack of heteroepitaxial semiconductor layers with at least one layer of sacrificial epitaxial material. The layers of sacrificial epitaxial material in the drain regions 130 and 140 are completely or at least partially removed forming voids in the drain regions 130 and 140. The voids in the drain regions 130 and 140 are then filled with a metallic material. In one embodiment, a thermal anneal process is performed to induce a reaction between the metallic material and the remaining epitaxial semiconductor material of the drain regions 130 and 140 to form the metal-semiconductor alloy regions 131 and 141 within the respective drain regions 130 and 140. In another embodiment, no thermal anneal process is performed, and the metallic material as deposited forms metallic layers in the drain regions 130 and 140. For illustrative purposes, FIG. 1A shows an example embodiment where all sacrificial epitaxial material is removed from the drain region 130, and where a portion of a sacrificial epitaxial semiconductor layer 144 remains within the drain region 140.

Furthermore, while the drain regions 130 and 140 are shown to include three layers of epitaxial material, the drain regions can be formed with other heteroepitaxial stack structures. For example, in one embodiment, the drain regions can be formed with two epitaxial semiconductor layers with a first sacrificial epitaxial semiconductor layer disposed between the substrate 110 and a second epitaxial semiconductor layer on which the vertical semiconductor fins are grown. In this embodiment, a Schottky barrier would be formed between the semiconductor substrate 110 and the subsequently formed metallic layer (which replaces the sacrificial epitaxial semiconductor layer), resulting in possible higher leakage, which may be acceptable in certain applications.

As shown in FIG. 1A, the vertical drain contacts 260 are formed to a depth to enable contact with the respective metal-semiconductor alloy regions 131 and 141 within the respective drain regions 130 and 140. The use of metallic regions (e.g., the metal-semiconductor alloy regions 131 and 141) with the drain regions 130 and 140 provides lower resistance drain regions 130 and 140 as compared to drain regions formed entirely of doped semiconductor material. Since the metal-semiconductor alloy regions 131 and 141 of the drain regions 130 and 140 extend along at least a portion or the entire length of the vertical semiconductor fins 160 and 170 (i.e., extend along the device width of the vertical FET devices), the voltage drop along the drain regions 130 and 140 (from the drain contacts 260 to the opposing ends of the drain regions 130 and 140) is reduced, leading to higher Vds uniformity and therefore higher drive current. This is achieved without penalizing device capacitance, since the change to the vertical FET device structure is in the metallic materials used to form the drain regions 130 and 140, rather than the geometry. The resulting reduction in the drain resistance allows for a reduction in the drain contact opening size (at some cost to external resistance, depending on the given structure), which in turn will reduce parasitic capacitance and therefore dynamic power consumption.

It is to be understood that while the example embodiment of FIGS. 1A and 1B shows the source regions 230/240 formed on top of the vertical semiconductor fins 160/170 and the drain regions 130/140 formed in the substrate 110 below the vertical semiconductor fins 160/170, the vertical FET devices can be fabricated with drain regions formed on top of the vertical semiconductor fins 160/170 and source regions formed in the substrate 110 below the vertical semiconductor fins 160/170. In this regard, the term "source/drain region" as used herein means that a given source/drain region can be either a source region or a drain region, depending on the application.

It is to be further understood that FIGS. 1A and 1B show an example embodiment in which the gate electrodes 190 in each device region R1 and R2 are commonly connected to one gate contact 280, the vertical semiconductor fins 160 and 170 are commonly connected to respective drain regions 130 and 140, and the source regions 230 and 240 are commonly connected to one source contact 270. In this embodiment, the gate structures 200 of the vertical semiconductor fins 160 (channel segments) of the vertical FET device in the first device region R1 are concurrently activated or deactivated based on the voltage applied to the gate contact 280 in the device region R1. Similarly, the gate structures 200 of the vertical semiconductor fins 170 of the vertical FET device in the second device region R1 are concurrently activated or deactivated based on the voltage applied to the gate contact 280 in the second device region R2.

In an alternate embodiment, the gate structures 200 in the device regions R1 and R2 can be separate structures, each connected to a separate gate contact. With this alternate embodiment, the different channel segments of the vertical FET devices can be independently controlled to selectively activate or deactivate the different segments of the vertical FET devices, as needed, depending on the application (e.g., controllably adjust the driving strength (amount of current) of the vertical FET devices in the device regions R1 and R2).

Methods for fabricating the semiconductor device 100 shown in FIGS. 1A/1B will now be discussed in further detail with reference to FIGS. 2 through 42, which schematically illustrate the semiconductor device 100 of FIGS. 1A/1B at various stages of fabrication, as well as alternate embodiments of the semiconductor device of FIG. 1. It is to be understood that the schematic views of the semiconductor structures in FIGS. 2~17A and 20~32A are perspective views of the semiconductor device 100 of FIGS. 1A/1B at different stages of fabrication in an Y-Z plane showing two separate device regions R1 and R2 that are formed adjacent to each other in the Y direction, and that the schematic views of the semiconductor structures in FIGS. 32B~42 are perspective views of the semiconductor device 100 of FIGS. 1A/1B at different stages of fabrication the X-Z plane of FIGS. 1A/1B showing two separate device regions R1 and R2 that are formed adjacent to each other in the X direction.

FIG. 2 is a cross-sectional view of a semiconductor structure at an initial stage of fabrication starting with a semiconductor substrate 110 and a silicon nitride (SiN) layer 112 (or "pad nitride" layer) formed on a surface of the semiconductor substrate 110, according to an embodiment of the invention. In one embodiment, the substrate 110 comprises a bulk semiconductor substrate formed of, e.g., silicon, or other types of semiconductor substrate materials that are commonly used in bulk semiconductor fabrication processes such as germanium, silicon-germanium (SiGe) alloy, silicon carbide (SiC), silicon-germanium carbide (SiGeC) alloy, or compound semiconductor materials (e.g. III-V and II-VI). Non-limiting examples of compound semiconductor materials include gallium arsenide (GaAs), indium arsenide (InAs), and indium phosphide (InP).

In another embodiment, the substrate 110 may comprise a SOI (silicon on insulator) substrate, which comprises an insulating layer (e.g., oxide layer) disposed between a base semiconductor substrate (e.g., silicon substrate) and an active semiconductor layer (e.g., active silicon layer) in which active circuit components are formed. In other embodiments, the substrate 110 may be a semiconductor-on-insulator substrate (SeOI), a germanium-on-insulator substrate (GeOI), or a silicon-germanium-on-insulator substrate (SGOI). In all embodiments, an upper surface or layer of the SOI substrate or the bulk semiconductor substrate, for example, may comprises single crystalline silicon. The thickness of the substrate 110 will vary depending on the application. For example, the base substrate 112 may have a thickness in a range of about 0.5 mm to about 1.5 mm.

Figure 3:
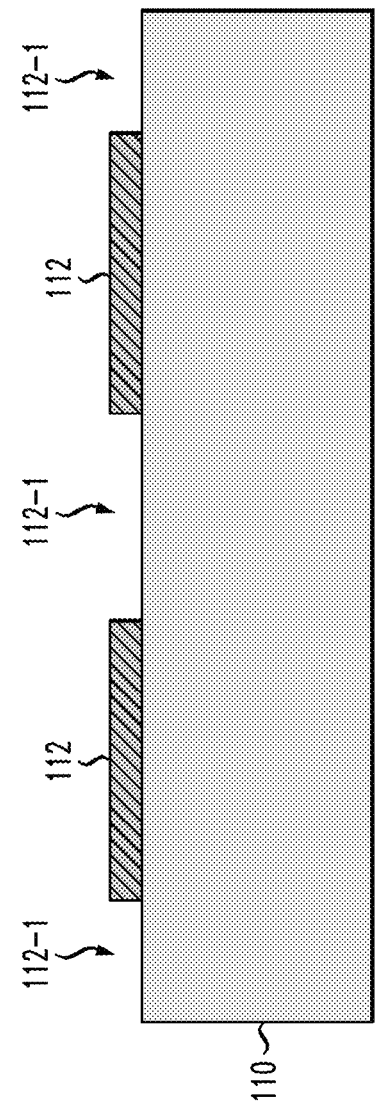

A next step in the illustrative fabrication process comprises patterning the pad nitride layer 112 to form an etch mask that is used to etch isolation trenches in the semiconductor substrate 110. For example, FIG. 3 is a schematic cross-sectional side view of the semiconductor structure of FIG. 2 after patterning the pad nitride layer 112 to form an etch mask comprising openings 112-1 that define isolation regions to be formed in a surface of the semiconductor substrate 110, according to an embodiment of the invention. The pad nitride layer 112 can be patterned using standard photolithography techniques. For example, a layer of photoresist material is deposited on top of the pad nitride layer 112 and lithographically patterned (exposed and developed) to form a photoresist mask having a target pattern which is to be transferred to the pad nitride layer 112. An etch process is then performed using the photoresist mask to etch exposed portions of the pad nitride layer 112 down to the surface of the semiconductor substrate 110 and thereby form the openings 112-1 in the pad nitride layer 112. The etch process can be performed using a dry etch process such as RIE (reactive ion etching) or other etch processes with etching chemistries that are suitable to etch the material of the pad nitride layer 112.

Figure 4:
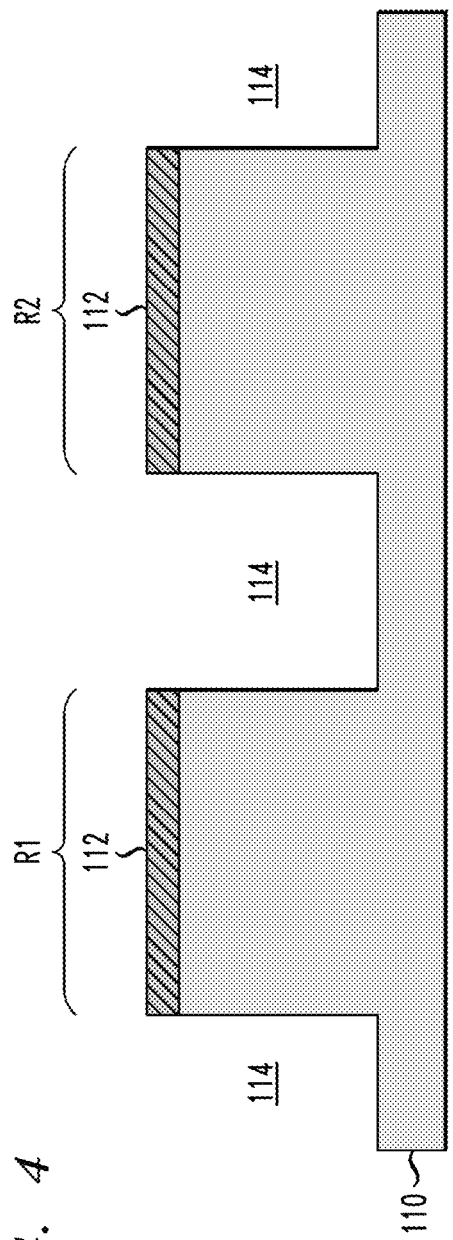
Figure 5:
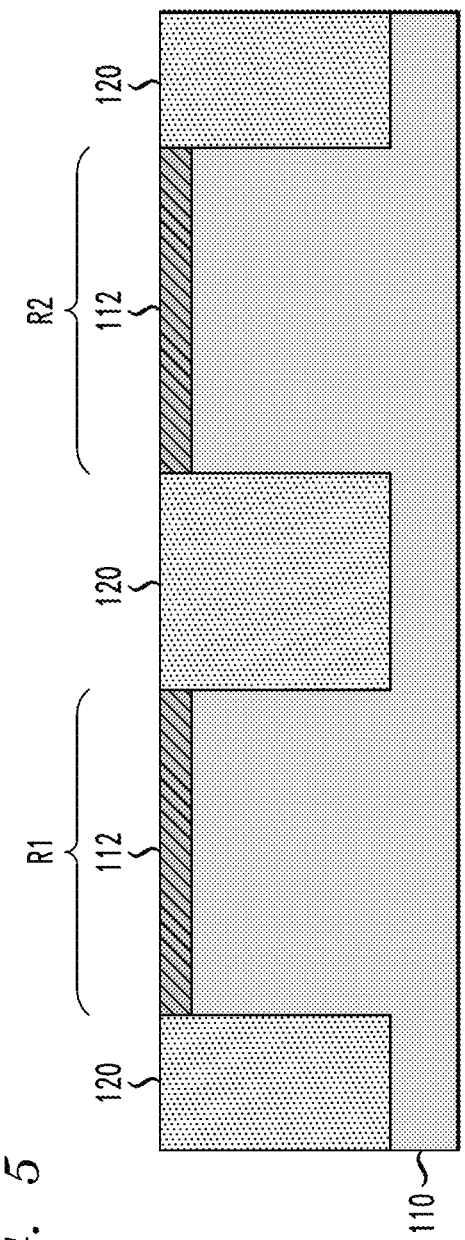

The fabrication process continues with forming shallow trench isolation (STI) regions in the surface of the semiconductor substrate 110 to define device regions. The STI regions can be formed using a standard technique that involves, e.g., etching a pattern of trenches in the surface of the substrate 110, depositing one or more insulating/dielectric materials (such silicon dioxide) to fill the trenches, and then removing the excess insulating/dielectric material using a technique such as chemical-mechanical planarization (CMP). The STI regions are formed to define a plurality of isolated device regions in which vertical FETs according to embodiments of the invention are formed. FIGS. 4 and 5 schematically illustrate a method for fabricating STI regions in the surface of the semiconductor substrate 110.

In particular, FIG. 4 is a schematic cross-sectional side view of the semiconductor structure of FIG. 3 after etching portions of the semiconductor substrate 110 exposed through the openings 112-1 of the pad nitride layer 112 to form a pattern of trenches 114 in the surface of the substrate 110. The pattern of trenches 114 can be formed using a standard dry etch process to recess the exposed surface regions of the substrate 110 to form the trenches 114. Further, FIG. 5 is a schematic cross-sectional side view of the semiconductor structure of FIG. 4 after filling the trenches 114 with insulating/dielectric material to form STI regions 120. The insulating/dielectric material may include, for example, a conformal SiN liner that is deposited initially to line the sidewalls and bottom surface of the trenches 114, followed by a blanket deposition of an oxide material such as $SiO_2$ or silicon oxynitride (SiON) to fill the trenches 114. The overburden (excess) insulating/dielectric material is removed using CMP, for example, by planarizing the surface of the semiconductor structure down to the surface of the remaining portions of the pad nitride layer 112, as shown in FIG. 5.

Figure 6:
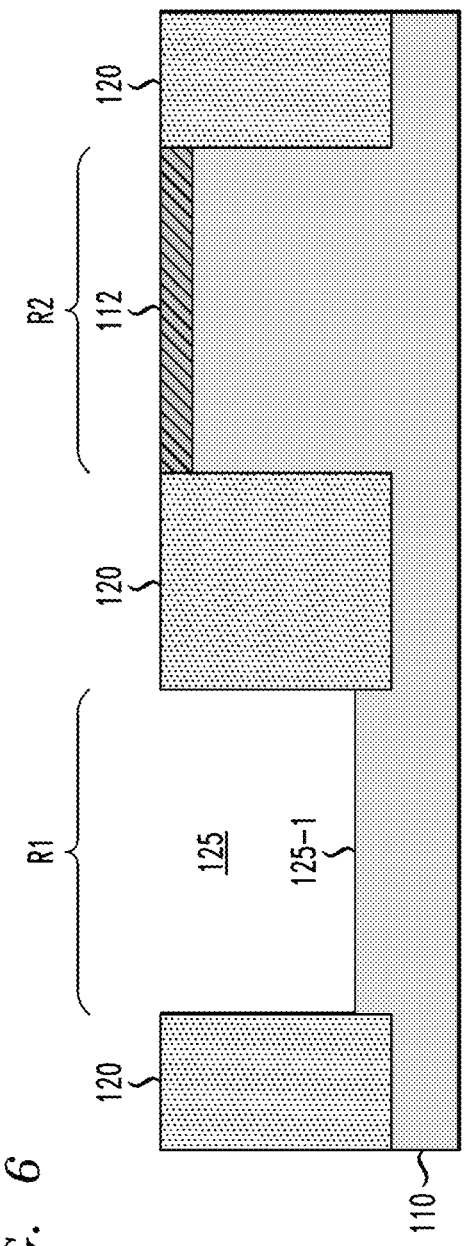

A next process module in the exemplary fabrication process comprises a drain formation process to form drain regions for the vertical FET devices, as schematically illustrated in FIGS. 6, 7, 8 and 9, for example. The drain process module comprises recessing each of the device regions in which a first type of FET device (e.g., n-type FET) will be formed, and forming a drain region for each of the first type of FET devices, followed by recessing each of the device regions in which a second type of FET device (e.g., p-type FET) will be formed, and forming a drain region for each of the second type of FET devices. For example, FIG. 6 is a schematic cross-sectional side view of the semiconductor structure of FIG. 5 after recessing the first device region R1 by etching the pad nitride layer 112 and the underlying portion of the substrate 110 to form a recess 125 within the active area defined by the surrounding STI regions 120.

In one embodiment, the recess 125 is formed by a process which comprises, for example, forming a mask (e.g., photoresist mask) over the surface of the semiconductor structure, which exposes the first device region R1 (as well as other device regions in which the same type of vertical FET structure will be formed), followed by one or more separate etch processes to remove the portion of the pad nitride 112 in the device region R1, and etch down the underlying portion of the substrate 110 to form the recess 125. In one embodiment, the pad nitride 112 can be etched using a wet etch process or a dry etch process (e.g., RIE). The underlying substrate 110 can be etched using a directional RIE etch process or any suitable etch process that etches the material of the substrate 110 selective to the insulating material of the surrounding STI regions 120. As shown in FIG. 6, the recess 125 is formed to a depth such that a bottom surface 125-1 of the recess 125 is less than a depth of the adjacent STI regions 120. In one embodiment, the STI regions 120 have a depth in the range of about 10 nm to about 300 nm.

Figure 7:
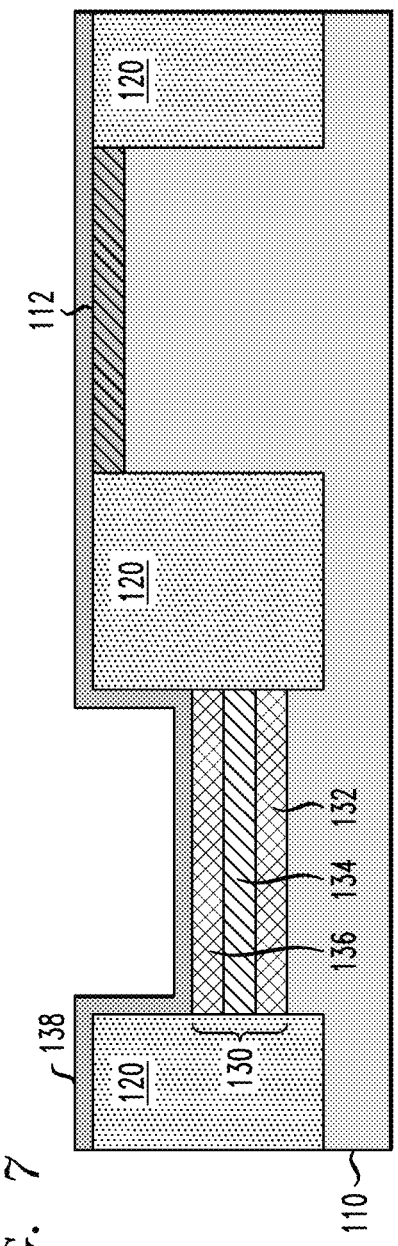

A next step in the illustrative fabrication process comprises forming a drain region in the device region R1. For example, FIG. 7 is a schematic cross-sectional side view of the semiconductor structure of FIG. 6 after forming a drain region 130 on the bottom surface 125-1 of the recess 125 within the device region R1. In one embodiment of the invention, as shown in FIG. 7, the drain region 130 comprises a stack of epitaxially grown semiconductor layers comprising a first epitaxial semiconductor layer 132, a second epitaxial semiconductor layer 134, and a third epitaxial semiconductor layer 136. The second epitaxial semiconductor layer 134 comprises a sacrificial layer that is at least partially removed and replaced with a transition metal which is used to form a metal-semiconductor alloy region (as discussed in further detail below with reference to FIGS. 36, 37 and 38). In one embodiment of the invention, the drain region 130 is formed with a total thickness in a range of about 10 nm to about 250 nm.

In forming the drain region 130, the epitaxial growth of the first epitaxial semiconductor layer 132 starts on the recessed surface 125-1 of the semiconductor substrate 110 at the bottom of the recess 125, and continues with a bottom-up epitaxial growth of the second and third epitaxial semiconductor layers 134 and 136. The exposed recessed surface 125-1 of the substrate 110 can be cleaned and prepared for epitaxial growth of the first epitaxial semiconductor layer 132. The epitaxial semiconductor layers 132, 134 and 136 can be epitaxially grown using known techniques, such as CVD (chemical vapor deposition), MOCVD (metal-organic CVD), LPCVD (Low Pressure CVD), MBE (molecular beam epitaxy), VPE (vapor-phase epitaxy), or other known epitaxial growth techniques which are suitable for the given process flow. The epitaxial deposition is performed selectively so that epitaxial material is not formed on the exposed surfaces of the STI regions 120 and nitride mask layer 112.

The type of epitaxial semiconductor materials that are used to form the heteroepitaxial stack structure of the drain region 130 will vary depending on various factors. These factors include, but are not limited to, the type of material of the substrate 110, the type of material used to subsequently form the channel fin structures, the device type (e.g., n-type or p-type) that is to be formed in the given device region, and the etch selectivity of the sacrificial epitaxial semiconductor layer 134 with respect to the first and third epitaxial semiconductor layers 132 and 136.

More specifically, the epitaxial semiconductor layers 132/134/136 of the drain region 130 are selected to have the same or similar lattice constants to thereby minimize mechanical stress and reduce lattice defects within the heteroepitaxial stack structure of the drain region 130 and at the interfaces between the drain region, the substrate 110, and subsequently formed vertical semiconductor fins. For example, the first epitaxial semiconductor layer 132 is preferably formed of a semiconductor material that has a lattice constant which is the same as, or closely matched to, the lattice constant of the material of the recessed surface 125-1 of the semiconductor substrate 110. Further, the second epitaxial semiconductor layer 134 is preferably formed of a semiconductor material that has a lattice constant which is the same as, or closely matched to, the lattice constant of the material of the first epitaxial semiconductor layer 134. Moreover, the third epitaxial semiconductor layer 136 is preferably formed of a semiconductor material that has a lattice constant which is the same as, or closely matched to, the lattice constant of the material of the second epitaxial layer 134, as well as the epitaxial semiconductor material that used to form the vertical semiconductor fins.

In one embodiment of the invention, assuming that the recessed surface 125-1 of the substrate 110 comprises crystalline Si or SiGe, for example, the heteroepitaxial stack structure of the drain region 130 can be formed with layers of epitaxial Si and epitaxial SiGe. In particular, for an n-type vertical FET, the first epitaxial semiconductor layer 132 can be epitaxial Si, the second (sacrificial) epitaxial semiconductor layer 134 can be epitaxial SiGe, and the third epitaxial layer 136 can be epitaxial Si. With a Si/SiGe/Si heteroepitaxial stack, the sacrificial SiGe layer is formed with a sufficient amount of Ge content so that the sacrificial SiGe layer can be etched selectively to the adjacent epitaxial Si layers. For a p-type vertical FET, the first epitaxial semiconductor layer 132 can be epitaxial SiGe, the second (sacrificial) epitaxial semiconductor layer 134 can be epitaxial Si, and the third epitaxial layer 136 can be epitaxial SiGe. With a SiGe/Si/SiGe heteroepitaxial stack, the sacrificial Si layer can be etched selectively to the adjacent epitaxial SiGe layers assuming the SiGe layers have a sufficient concentration of Ge to allow for such etch selectivity.

In another embodiment, the drain region 130 may comprise a SiGe/SiGe/SiGe heteroepitaxial stack, wherein the middle sacrificial SiGe layer (e.g., epitaxial semiconductor layer 134) is formed with concentration of Ge that sufficiently greater than the Ge concentration of the adjacent upper and lower SiGe layers (e.g., epitaxial semiconductor layers 132 and 136), which allows the middle sacrificial SiGe layer to etched selective to the adjacent upper and lower epitaxial SiGe layers. In other alternative embodiments, for an n-type vertical FET, the drain region 130 can be formed using SiGe, and for a p-type vertical FET, the drain region 130 can be formed using SiC.

Moreover, the various layers of the drain region 130 can be doped using standard doping techniques. For example, the doping of a given layer of the drain region 130 can be performed in-situ during the epitaxial growth of the layer, or ex-situ by ion implantation. For example, the drain region 130 can be doped with Group III elements (for p-type vertical FET devices) or Group V elements (for n-type vertical FET devices). Typical dopants include Boron, Arsenic, Phosphorus, Gallium, Antimony, etc. For example, boron is a p-type dopant, whereas Phosphorus is an n-type dopant.

In other embodiments, for high-performance applications, the heteroepitaxial stack structure of the drain region 130 can be formed with different III-V compound semiconductor material layers including, but not limited to, GaAs (Gallium Arsenide), InP (Indium Phosphide), InGaAs (Indium Gallium Arsenide), etc. As is known in the art, the use of a compound semiconductor material (e.g., III-V compound semiconductor material) provides a higher carrier mobility than Si and, therefore, allows for the fabrication of high-speed and high-performance semiconductor devices.

As further shown in FIG. 7, after forming the drain region 130 in the first device region R1, a hardmask layer 138 is formed on the surface of the semiconductor structure to cover, e.g., the drain region 130, the STI regions 120, and the pad nitride layer 112. In one embodiment, the hardmask layer 138 is formed by conformally depositing an oxide material over the surface of the semiconductor structure. In other alternative embodiments, the hardmask layer 138 can be formed by conformally depositing a boride, carbide, or a nitride material. The hardmask layer 138 serves to protect the drain regions (e.g., drain region 130) that are formed in the first device region R1 when forming the drain regions in the second device region R1.

FIG. 8 is a schematic cross-sectional side view of the semiconductor structure of FIG. 7 after etching the second device region R2 to form a recess 127 within the active area defined by the surrounding STI regions 120. In one embodiment, the recess 127 is formed by a process which comprises, for example, forming a mask (e.g., photoresist mask) over the surface of the semiconductor structure, which exposes the second device region R2 (as well as other device regions in which the same type of vertical FET structure will be formed), followed by one or more separate etch processes to remove the portion of the hardmask layer 138 and the pad nitride layer 112 in the second device region R2, and etch down the underlying portion of the substrate 110 to form the recess 127. The hardmask layer 138, the pad nitride layer 112, and the substrate 110 are etched using one or more sequential etch processes with etching chemistries that are suitable to etch the respective materials of the hardmask layer 138, the pad nitride layer 112, and the substrate 110. As shown in FIG. 8, the recess 127 is formed to a depth such that a bottom surface 127-1 of the recess 127 is less than a depth of the adjacent STI regions 120.

A next step in the illustrative fabrication process comprises forming a drain region in the second device region R2 and recessing the STI regions 120. For example, FIG. 9 is a schematic cross-sectional side view of the semiconductor structure of FIG. 8 after forming a drain region 140 on the bottom surface 127-1 of the recess 127 within the device region R2. As shown in FIG. 9, the drain region 140 comprises a stack of epitaxially grown semiconductor layers comprising a first epitaxial semiconductor layer 142, a second epitaxial semiconductor layer 144, and a third epitaxial semiconductor layer 146. As noted above, the second epitaxial semiconductor layer 144 comprises a sacrificial layer that is at least partially removed and replaced with a transition metal which is used to form a metal-semiconductor alloy region (as discussed in further detail below with reference to FIGS. 36, 37 and 38). In one embodiment of the invention, the drain region 140 is formed with a total thickness in a range of about 10 nm to about 250 nm.

Similar to the factors discussed above with respect to formation of the drain region 130 in the device region R1, the type of epitaxial semiconductor materials that are used to form the heteroepitaxial stack structure of the drain region 140 will vary depending on various factor including, but not limited to, the type of material of the substrate 110, the type of material used to subsequently form the channel fin structures, the device type (e.g., n-type or p-type) that is to be formed in the given device region R2, and the etch selectivity of the sacrificial epitaxial semiconductor layer 144 with respect to the first and third epitaxial semiconductor layers 142 and 146 of the drain region 140. It is to be understood that while embodiments are described with drain regions 130 and 140 formed on the substrate 110, this is for descriptive purposes only and should not be construed as a limitation, as the drain regions 130 and 140 shown throughout the figures may alternatively be source regions of the vertical FET devices.

After forming the drain region 140, the remaining hardmask layer 138 is removed from the surface of the semiconductor structure. In addition, any remaining pad nitride material 112 is removed from the surface of the semiconductor substrate. Following the pad nitride removal, the STI regions 120 are etched to recess the STI regions 120 down to a level that is slightly higher than an upper surface of the drain regions 130 and 140, as shown in FIG. 9. After recessing the STI regions 120, a next process module in the exemplary fabrication process comprises a bottom spacer and channel formation process module, as schematically illustrated in FIGS. 10, 11, 12 and 13, for example.

Figure 10:
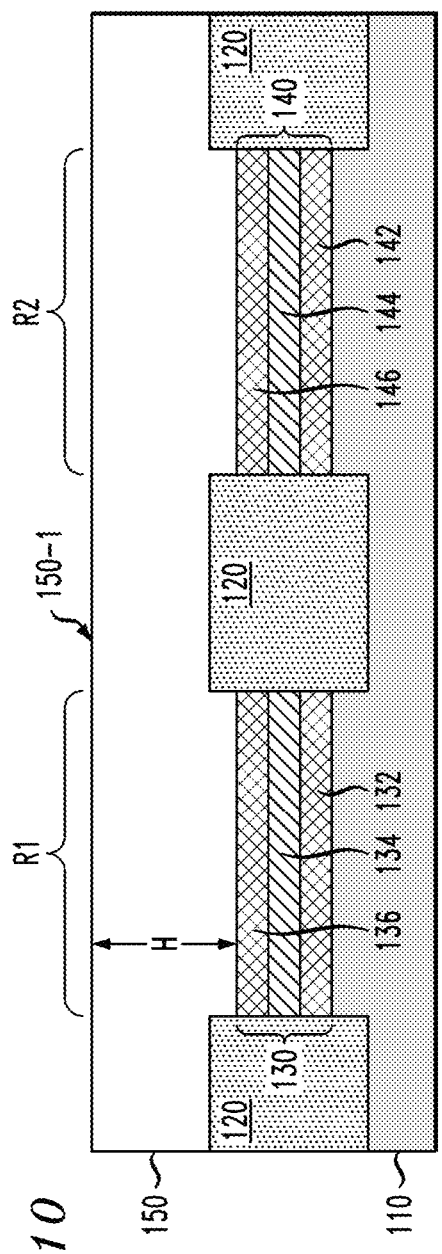

In particular, FIG. 10 is a schematic cross-sectional side view of the semiconductor structure of FIG. 9 after blanket depositing a layer of insulating material 150 over the semiconductor structure and then planarizing the layer of insulating material 150 (via CMP, for example) to provide a flat, uniform upper surface 150-1. The layer of insulating material 150 is utilized during subsequent processing steps to form trenches that define a pattern of vertical semiconductor fins (or vertical semiconductor channels) for the vertical FET devices, and to define a bottom spacer for the vertical FETs. As shown in FIG. 10, the layer of insulating material 150 is planarized so that the upper surface 150-1 reaches a target height H above the drain regions 130 and 140, wherein the height H defines a baseline vertical height of the vertical semiconductor fins that are to be subsequently formed.

In one embodiment, the layer of insulating material 150 comprises a low-K dielectric material such as $SiO_2$, SiN, SiBCN or SiOCN, or other dielectric materials that are suitable for the given application and process flow such as SiN, hydrogenated silicon carbon oxide, silicon based low-k dielectrics, porous dielectrics, or organic dielectrics including porous organic dielectrics. In addition, the layer of insulating material 150 may be formed using known suitable deposition techniques, such as, for example, atomic layer deposition (ALD), chemical vapor deposition (CVD), plasma enhanced chemical vapor deposition (PECVD), spin on deposition, physical vapor deposition (PVD), or molecular beam deposition (MBD).

Figure 11:
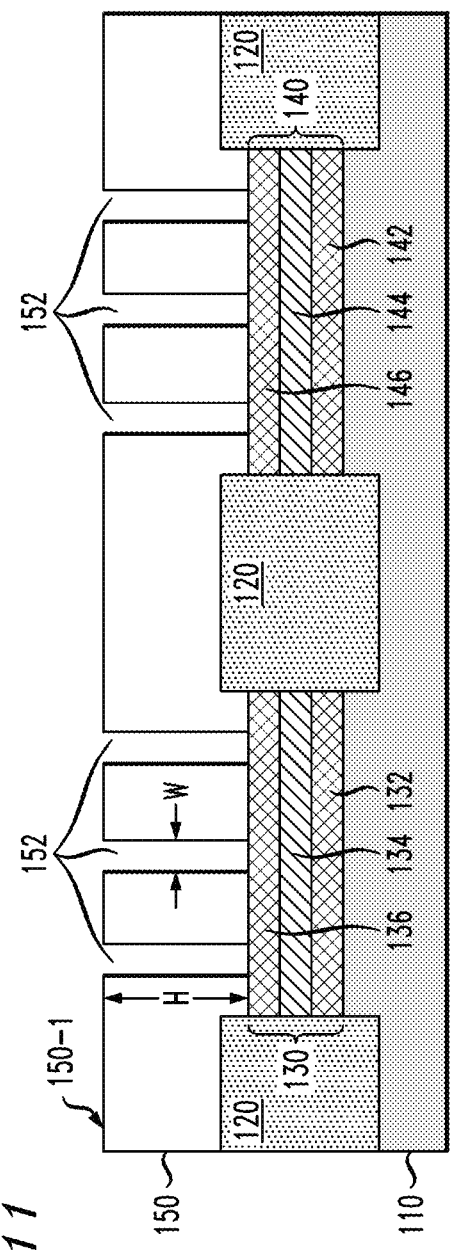

Next, FIG. 11 is a schematic cross-sectional side view of the semiconductor structure of FIG. 10 after patterning the layer of insulating material 150 to form trenches 152 through the layer of insulating material 150 within the device regions R1 and R2. The trenches 152 can be formed using known techniques. For example, a layer of photoresist material is deposited on top of the layer of insulating material 150 and lithographically patterned (exposed and developed) to form a photoresist mask having a target pattern which defines a corresponding pattern of the trenches 152 to be transferred to the layer of insulating material 150. A directional dry etch process (e.g., plasma etch) is then performed using the photoresist mask to etch the trenches 152 in the layer of insulating material 150 down to the drain regions 130 and 140. With this process, the directional dry etch process is performed with an etch chemistry that is suitable to form high-aspect ratio trenches 152 with substantially vertical sidewalls in the layer of insulating material 150. The "high aspect ratio" trenches 152 are subsequently filled with epitaxial semiconductor material to fabricate vertical semiconductor fins for the vertical FET devices.

As is known in the art, the "aspect ratio" of a trench is defined as the ratio between the height H and the width W of the trench. In one embodiment of the invention, the trenches 152 (which have a width W and height H) are formed with an aspect ratio of about 1:3 or greater. More specifically, in one embodiment of the invention, the trenches 152 are formed with a width W in a range of about 8 nm to about 20 nm, and a height H in a range of about 100 nm to about 150 nm. In addition, the trenches 152 in each device region R1 and R2 are spaced with a pitch in a range of about 20 nm to about 200 nm.

A next step in the fabrication process comprises epitaxially growing semiconductor material in the trenches 152. For example, FIG. 12 is a cross-sectional schematic view of the semiconductor structure of FIG. 11 after completion of an epitaxy process in which the trenches 120 are completely filled with epitaxially grown semiconductor material to form vertical semiconductor fins 160 in the device region R1 and vertical semiconductor fins 170 in the device region R2. With this process, the epitaxial growth in the trenches 152 starts on the surface of the epitaxial drain regions 130 and 140 at the bottom of the trenches 120, and continues with a bottom-up epitaxial growth of semiconductor material until the trenches 152 are over slightly overfilled with the epitaxial semiconductor material protruding from the trenches 152 past the surface 150-1 of the insulating material 150. A CMP process is then performed to remove the overburden epitaxial material and planarize the upper surface of the vertical semiconductor fins 160 and 170, as shown in FIG. 12. The vertical semiconductor fins 160 and 170 can be formed with any type of epitaxial semiconductor material including, but not limited to, Si, $Si_xGe_y$, GaAs, InGaAs, or other typed of epitaxial compound semiconductor material which is suitable for the target application.

In one embodiment, the vertical semiconductor fins 160 and 170 in the respective device regions R1 an R2 are grown concurrently when the same epitaxial semiconductor material is used to form the vertical semiconductor fins 160 and 170. In another embodiment, the vertical semiconductor fins 160 and 170 in the respective device regions R1 an R2 are grown separately when different epitaxial semiconductor materials are used to form the vertical semiconductor fins 160 and 170. In one embodiment, when there is a lattice mismatch between the materials of the drain regions 130 and 140 and the epitaxial semiconductor material used to form the vertical semiconductor fins 160/170, a high-aspect ratio trapping (ART) technique can be utilized to grow epitaxial semiconductor material in the trenches 152 with a relatively defect free monocrystalline structure of the epitaxial semiconductor material (e.g., III-V material).

The ART technique is implemented to improve the quality of III-V heteroepitaxial films that are grown on Si, for example due to the potential for terminating defects at the sidewalls of the high aspect ratio trenches 152 that enclose the region of epitaxial growth. ART takes advantage of the well-known "necking" effect during epitaxial growth where threading dislocations and other defects are confined at the bottom of the trenches 152, while defects are suppressed in the lattice of materials at the non-crystalline trench sidewalls of the layer of insulating material 150, especially where the sidewalls are relatively high with respect to the growth area. As such, the growth of a III-V compound semiconductor material, for example, can be performed directly on the surface of the drain regions 130 and 140 even though a lattice-mismatch may be present between the epitaxial material of the drain regions 130 and 140, and the epitaxial material (e.g., III-V material) used to form the vertical semiconductor fins 160 and 170.

After the vertical semiconductor fins 160 and 170 are formed, a next step in the fabrication process comprises etching down the layer of insulation material 150 to form a bottom spacer for the vertical FET devices. For example, FIG. 13 is a schematic cross-sectional side view of the semiconductor structure of FIG. 12 after recessing the layer of insulating material 150 to form a lower insulating spacer 155 in each of the device regions R1 and R2. With this process, the layer of insulating material 150 is etched highly selective (e.g., greater than 10:1) to the material of the vertical semiconductor fins 160 and 170. The etch process can be performed using wet etch process with an etch solution chemistry that is configured to isotropically etch the layer of insulating material 150 highly selective to the epitaxial material of the vertical semiconductor fins 160 and 170. Alternatively, a low plasma etch process can be used to etch the etch the layer of insulating material 150 highly selective to the epitaxial material of the vertical semiconductor fins 160 and 170.

As shown in FIG. 13, the layer of insulating material 150 is recessed down to the upper surfaces of the STI regions 120, wherein the remaining portion of the insulating material 150 between the STI regions 120 forms the lower insulating spacers 155. The lower insulating spacers 155 serve to insulate the drain regions 130 and 140 from gate electrodes that are subsequently formed on the sidewalls of the vertical semiconductor fins 160 and 170.

It is to be understood that while each device region R1 is shown to have three vertical semiconductor fins 160 and device region R2 is shown to have three vertical semiconductor fins 170, the number of vertical semiconductor fins which are used to form a vertical FET in the device regions R1 and R2 can be more or less than 3, depending on the intended current handling capacity of the vertical FET devices. In one embodiment, the height H of the vertical semiconductor fins 160 and 170 is in a range of 30 nm to about 100 nm, the width W of the vertical semiconductor fins 160 and 170 is in the range of about 5 nm to about 30 nm, and a length L of the vertical semiconductor fins 160 and 170 is in a range of about 10 nm to about 2000 nm. In a non-limiting example, each semiconductor fin 160 and 160 may have a width W of about 5 nm, a length L of about 100 nm, and a height H of about 200 nm.

After forming the lower insulating spacers 155, a next process module in the exemplary fabrication process comprises a metal gate structure process module to form a metal gate structure around portions of the sidewalls of the vertical semiconductor fins 160 and 170, as schematically illustrated in FIGS. 14 through 23. For example, FIG. 14 is a schematic cross-sectional side view of the semiconductor structure of FIG. 13 after forming a gate stack structure 180 on each of the exposed sidewalls of vertical semiconductor fins 160 and 170. In one embodiment the gate stack structures 180 each comprise a gate dielectric layer formed on the vertical semiconductor fins 160 and 170, and a work function metal layer formed on the gate dielectric layer. In one embodiment, the gate stack structures 180 are formed, e.g., by depositing one or more conformal layers of gate dielectric material over the structure of FIG. 13, and depositing one or more conformal layers of work function metal over the conformal layer(s) of gate dielectric material. Thereafter, one or more directional dry etch processes are performed using known etching methods and etch chemistries to remove the portions of the gate dielectric material and work function metal on top of the vertical semiconductor fins 160/170 and other horizontal surfaces of the semiconductor structure, while maintaining the gate dielectric material and work function metal on the sidewalls of the vertical semiconductor fins 160/170, as shown in FIG. 14.

The type of dielectric material(s) used to form the gate dielectric layer will vary depending on the application. For example, the conformal gate dielectric layer may comprise, e.g., nitride, oxynitride, or oxide or high-k materials such as, $HfO_2$, $HfSiO_4$, $HfSiON$, $ZrO_2$, $Al_2O_3$, $TiO_2$, $Ta_2O_5$ $La_2O_3$, $SrTiO_3$, $LaAlO_3$, and combinations thereof. In one embodiment of the invention, the conformal dielectric material has a thickness in a range of about 0.5 nm to about 2.5 nm, which will vary depending on the target application. The conformal dielectric layer is deposited using known methods such as ALD, CVD, or PVD, for example. Further, the work function metal may comprise one or more of, for example, Zr, W, Ta, Hf, Ti, Al, Ru, Pa, metal oxides, metal carbides, metal nitrides, transition metal aluminides (e.g. $Ti_3Al$, TaC, TiC, TaMgC, or any combination thereof. The gate stack structures 180 formed on the vertical semiconductor fins 160 and 170 may be the same material or different materials, depending on the application (e.g., n-type or p-type vertical FET). When different materials are used to form the gate stack structures 180 in the different device regions R1 and R2, the gate stack structures 180 in the device regions R1 and R2 can be separately formed using known techniques. In one embodiment, the total thickness of the gate stack structures 180 is in a range of about 5 nm to about 15 nm.

Figure 16:
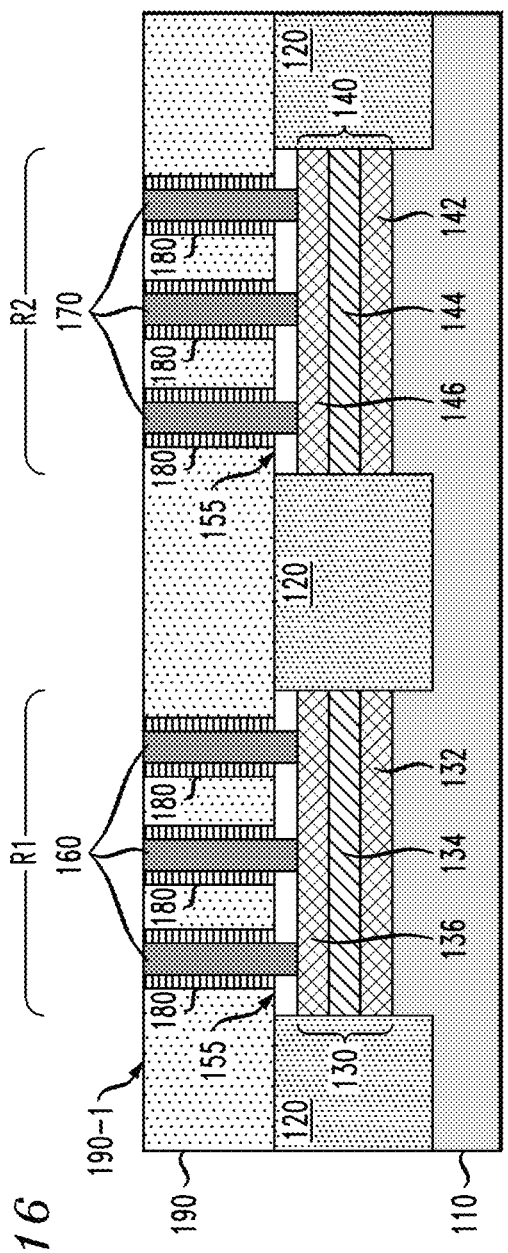

A next step in the exemplary process flow is to form a gate electrode layer that surrounds the vertical semiconductor fins 160/170. For example, FIG. 15 is a schematic cross-sectional side view of the semiconductor structure of FIG. 14 after depositing gate electrode material 190 to encapsulate the vertical semiconductor fins 160/170 in the gate electrode material 190. Further, FIG. 16 is a schematic cross-sectional side view of the semiconductor structure of FIG. 15 after etching/planarizing the layer of gate electrode material 190 down to the upper surface of the vertical semiconductor fins 160/170 to provide a planarized surface 190-1 of the gate electrode material 190. In one embodiment of the invention, the gate electrode material 190 is formed of low-resistance conductive material including, but not limited to tungsten, aluminum, or any metallic or conductive material that is commonly used to form gate electrode structures. The gate electrode material 190 can be deposited by CVD or PE-CVD, and planarized via CMP.

Figure 17A:
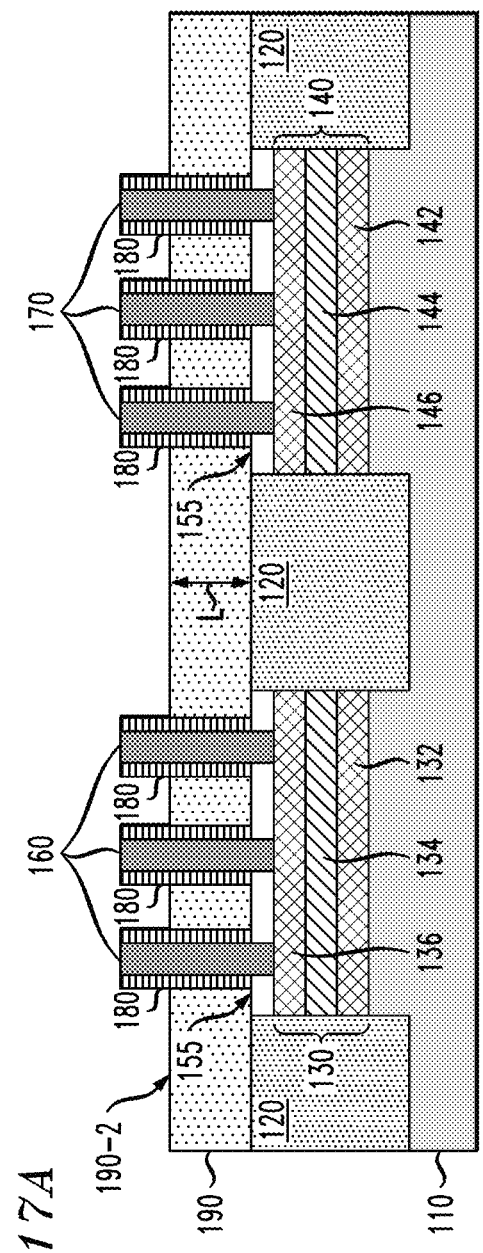
FIGS. 17A, 17B and 17C are schematic views of the semiconductor structure of FIG. 16 after recessing the layer of gate electrode material down between the vertical semiconductor fins.
Figure 17B:
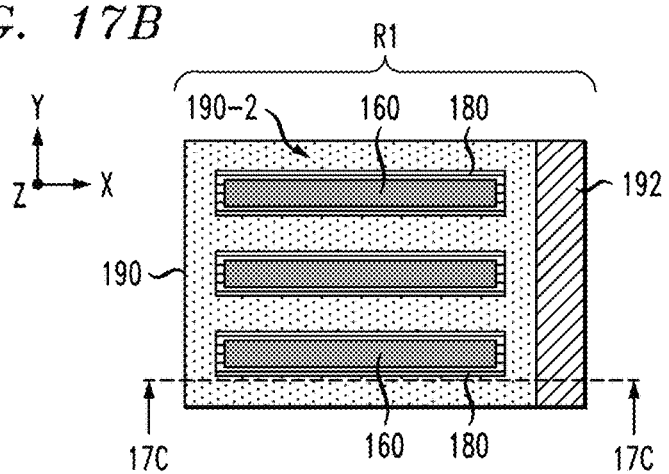
Figure 17C:
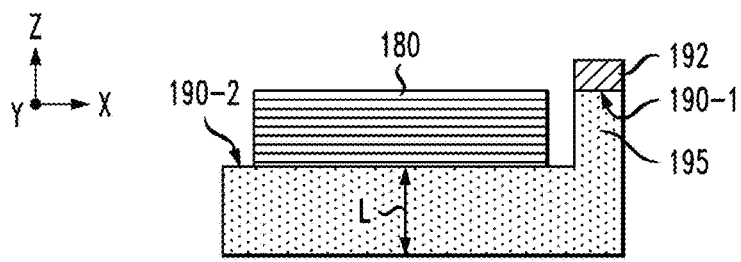

Following planarization of the gate electrode material 190, a next step comprises recessing portions of the gate electrode material 190 in the device regions R1 and R2 to define a gate length L for the vertical FETs in the device regions R1 and R2, as schematically illustrated in FIGS. 17A, 17B, and 17C. In particular, FIG. 17A is a schematic cross-sectional side view of the semiconductor structure of FIG. 16 after recessing the layer of gate electrode material 190 down between the vertical semiconductor fins 160/170 in the device regions R1 and R2 such that a recessed surface 190-2 of the gate electrode material 190 has a resulting thickness that defines a gate length L. FIG. 17B is a schematic top view of the device region R1 of FIG. 17A within the X-Y plane (such as shown in FIG. 1B). In addition, FIG. 17C is a schematic cross-sectional side view of the device region R1 of FIG. 17B taken along line 17C-17C in FIG. 17B (i.e., within the X-Z plane). The gate electrode recess process is performed to define the gate length L of the vertical FETs in the device regions R1 and R2, while leaving a portion of the gate electrode material 190 at the end portions of the vertical semiconductor fins 160/170 at the level of the planarized surface 190-1 of the gate electrode material 190. In one embodiment of the invention, the height L of the recessed surface 190-2 of the gate electrode material 190 above the surface of the bottom dielectric spacer 155 is in a range of about 15 nm to about 300 nm.

In particular, as shown in FIGS. 17B and 17C, prior to recessing the gate electrode material 190, a masking material (e.g., oxide material) is deposited on the planarized surface 190-1 of the gate electrode material 190 and patterned to form an etch mask 192 which covers portions of the gate electrode material 190 which are not to be recessed. As shown in FIG. 17C, when the gate electrode material 190 is etched down to form the recessed surface 190-2, a portion 195 of the gate electrode material 190 covered by the etch mask 192 is not etched. This portion 195 comprises an extended portion that serves as a gate contact region on which a gate contact is subsequently formed to the gate electrode material 190.

Figure 18:
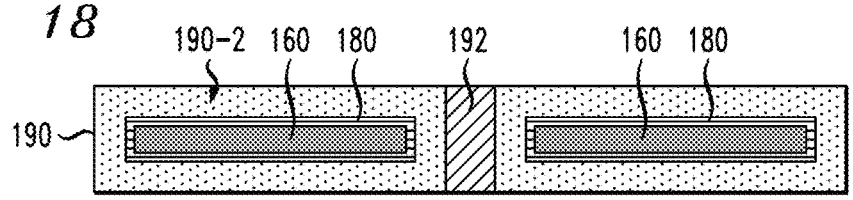
Figure 19:
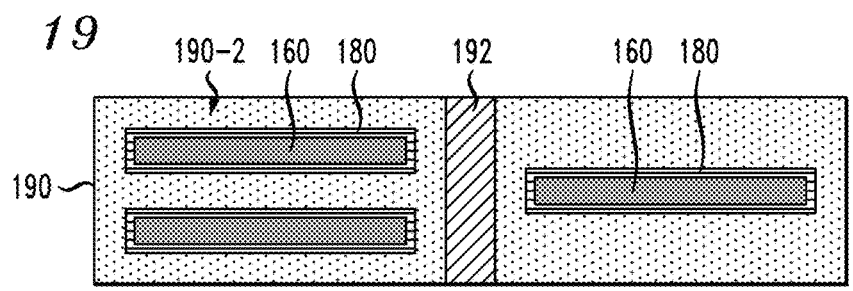

While FIG. 17B illustrates an embodiment of the device region R1 in which a vertical FET device is formed with three parallel vertical semiconductor fins 160 disposed side by side, in other embodiments of the invention, the vertical semiconductor fins 160 of the vertical FET device can be arranged in different configurations. For example, FIG. 18 is a schematic top view of another embodiment of the device region R1 showing two vertical semiconductor fins 160 arranged end-to-end with the surrounding gate electrode material 190 having the gate contact region 195 disposed between the ends of the vertical semiconductor fins 160. Moreover, FIG. 19 is a schematic top view of another embodiment of the device region R1 showing two vertical semiconductor fins 160 arranged side by side, and end-to-end with at least one other semiconductor fin 160, with the surrounding gate electrode material 190 having the gate contact region 195 disposed between the ends of the vertical semiconductor fins 160.

A next step in the illustrative fabrication process comprises removing a portion of the gate stack structures 180 on the sidewalls of the upper portions of the vertical semiconductor fins 160/170. For example, FIG. 20 is a schematic cross-sectional side view of the semiconductor structure of FIG. 17A after recessing the exposed portions of the gate stack structures 180 on the sidewalls of the vertical semiconductor fins 160/170 down to a level of the recessed surface 190-2 of the gate electrode material 190, according to an embodiment of the invention. The gate dielectric material and work function metal of the gate stack structures 180 can be etched highly selective to the materials of the vertical semiconductor fins 160/170 and the gate electrode material 190 using known etching techniques and suitable etch chemistries. In one embodiment of the invention, the exposed portions of the vertical semiconductor fins 160/170 extend above the recessed surface 190-2 in a range of about 25 am to about 100 nm.

Following the recess of the gate stack structures 180, a next step in the illustrative fabrication process comprises forming disposable spacers that are used to etch the gate electrode material 190 and thereby form individual gate electrodes on the gate stack structures 180 surrounding the vertical semiconductor fins 160/170. For example, FIG. 21 is a schematic cross-sectional side view of the semiconductor structure of FIG. 20 after forming disposable spacers 198 that encapsulate the exposed portions of the vertical semiconductor fins 160/170, according to an embodiment of the invention. In one embodiment, the disposable spacers 198 are formed by depositing a thin conformal layer of oxide or nitride spacer material (e.g., $SiO_2$, SiN) over the semiconductor structure shown in FIG. 20 using, for example, an ALD or PE ALD process, followed by an etch process to pattern the conformal layer of spacer material and thereby form the individual disposable spacers 198 as shown in FIG. 21. The disposable spacers 198 have sidewalls that extend past the sidewalls of the gate stack structures 180 at a given distance which defines the thickness of the individual gate electrodes that are to be formed on the sidewall surfaces of the gate stack structures 180 after etching the layer of gate electrode material 190 using the disposable spacers 198 as an etch mask.

In particular, FIG. 22 is a schematic cross-sectional side view of the semiconductor structure of FIG. 21 after using the disposable spacers 198 as an etch mask to etch the exposed portions of the gate electrode material 190 to form metal gate structures 200 on the vertical semiconductor fins 160/170, according to an embodiment of the invention. In addition, FIG. 23 is a schematic cross-sectional side view of the semiconductor structure of FIG. 22 after removing the disposable spacers 198 from the upper portions of the vertical semiconductor fins 160/170. As shown in FIGS. 22 and 23, the exposed portion of the gate electrode material 190 is recessed down to the STI regions 120 and bottom spacer 155 in the device regions R1 and R2. On the other hand, portions of the gate electrode material 190 that are covered by the disposable spacers 198 remain on the sidewall surfaces of the gate stack structure 180 to form the metal gate structures 200. Each metal gate structure 200 comprises an individual gate electrode 190 and gate stack structure 180 (gate dielectric and work function metal layer). In one embodiment of the invention, the gate electrode material 190 which remains on the surfaces of a given gate stack structure 180 has a thickness in a range of about 2 nm to about 5 nm.

Figure 24:
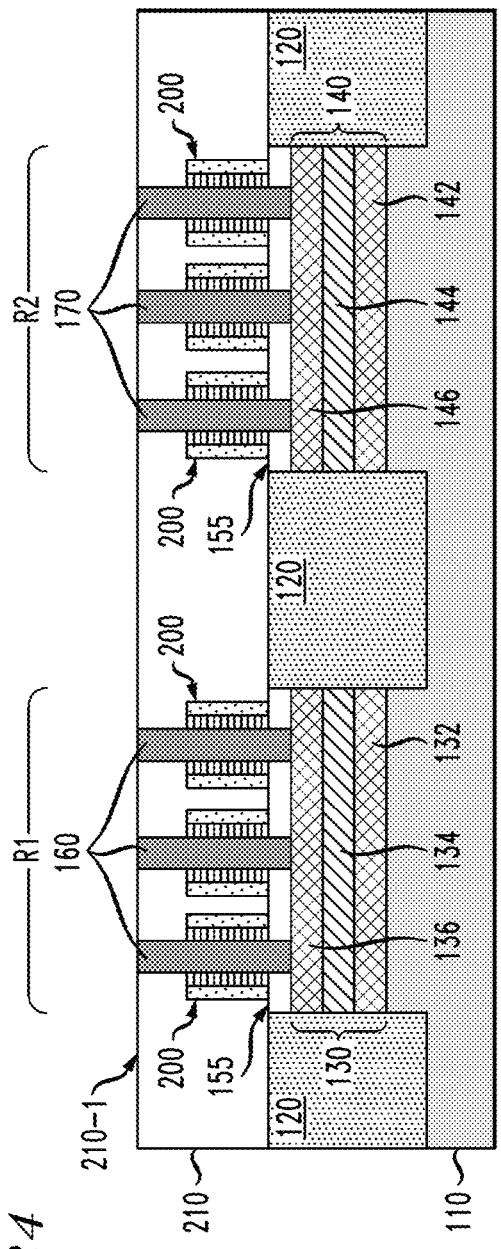
Figure 25:
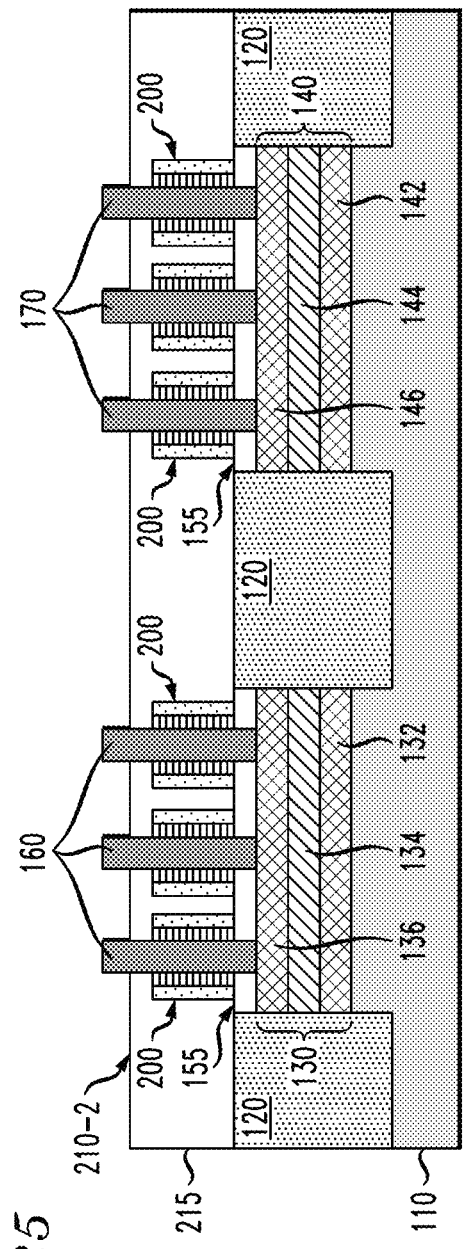

A next step in the illustrative fabrication process is to form the upper insulating spacer 215, using a process flow as schematically illustrated in FIGS. 24 and 25. In particular, FIG. 24 is a schematic cross-sectional side view of the semiconductor structure of FIG. 23 after depositing a layer of insulating spacer material 210 over the surface of the semiconductor structure and planarizing the layer of insulating spacer material 210 down to the upper surface of the vertical semiconductor fins 160/170 to provide a planarized surface 210-1 of the insulating spacer material 210. In one embodiment of the invention, the insulating spacer material 210 comprises a low-K dielectric material such as SiO2, SiN, SiBCN or SiOCN, or other dielectric materials that are suitable for the given application and process flow such as SiN, hydrogenated silicon carbon oxide, silicon based low-k dielectrics, porous dielectrics, or organic dielectrics including porous organic dielectrics. In addition, the insulating spacer material 210 may be formed using known suitable deposition techniques, such as, for example, ALD, CVD, PECVD, spin on deposition, PVD, or MBD.

Further, FIG. 25 is a schematic cross-sectional side view of the semiconductor structure of FIG. 24 after etching the insulating spacer material 210 down to form the upper insulating spacer 215 having a recessed surface 210-2 below an upper surface of the vertical semiconductor fins 160-170. In one embodiment of the invention, the insulating spacer material 210 is recessed using a directional dry etch process (e.g., RIE) to recess the layer of insulating spacer material and expose upper portions of the vertical semiconductor fins 160/170, as shown in FIG. 25. The etch process is performed to etch the layer of insulating spacer material 210 highly selective to the material of the vertical semiconductor fins 160/170 to form the upper insulating spacer 215. The upper insulating spacer 215 serves to insulate the metal gate electrodes 200 from surrounding structures. In one embodiment of the invention, the lower insulating spacers 155 and upper insulating spacer 215 are made of the same material. In another embodiment, the spacers 155 and 215 can be formed of different low-k dielectric materials.

Figure 26:
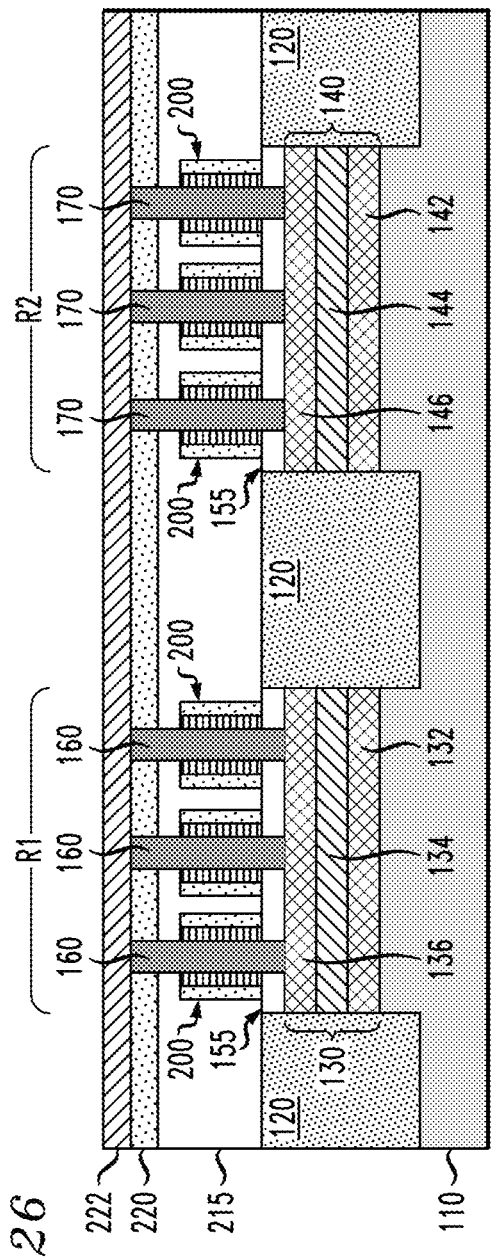

Following formation of the upper insulating spacer 215, the process flow continues with forming source regions of the vertical FET devices using a process flow as schematically illustrated in FIGS. 26~31. In particular, FIG. 26 is a schematic cross-sectional side view of the semiconductor structure of FIG. 25 after forming an ILD (inter-level dielectric layer) 220 over the upper insulating spacer 215 and forming a hardmask layer 222 over the ILD layer 220, according to an embodiment of the invention. The ILD layer 220 is formed by depositing a conformal layer of dielectric material over the surface of the semiconductor structure of FIG. 25, and then planarizing the dielectric material down to the upper surface of the vertical semiconductor fins 160/170. In one embodiment of the invention, the ILD layer 220 is formed of a material that is different from the dielectric material of the upper insulating spacer 215. For example, the ILD layer 220 may be formed of an oxide, such as $SiO_2$, using suitable deposition techniques, whereas the upper insulating spacer 215 is formed of a silicon nitride. In one embodiment, the hardmask layer 222 is formed by depositing layer of nitride material, such as SiN, or some other suitable material that can be etched selectively to the ILD layer 220.

Figure 27:
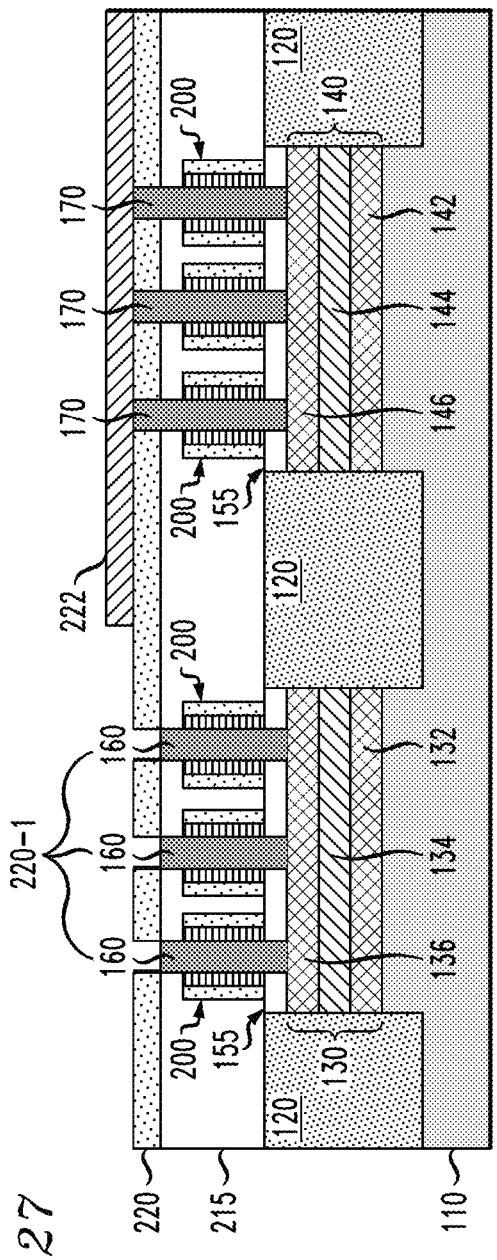

A next step in the illustrative fabrication process comprises patterning the hardmask layer 222 to expose portions of the ILD layer 220 in the device regions R1, and then etching the upper portions of the exposed vertical semiconductor fins 160 to form openings in which source regions are epitaxially grown. For example, FIG. 27 is a schematic cross-sectional side view of the semiconductor structure of FIG. 26 after patterning the hardmask layer 222 to expose portions of the ILD layer 220 in the device regions R1, and etching down the upper portions of the vertical semiconductor fins 160 to form openings 220-1 in the ILD layer 220. In one embodiment, the vertical semiconductor fins 160 are recessed down to at least the level of the upper insulating spacer 215, for example, wherein the upper surface of vertical semiconductor fins 160 are approximately co-planar with the interface between the ILD layer 220 and the upper insulating spacer 215, as shown in example embodiment of FIG. 27.

Figure 28:
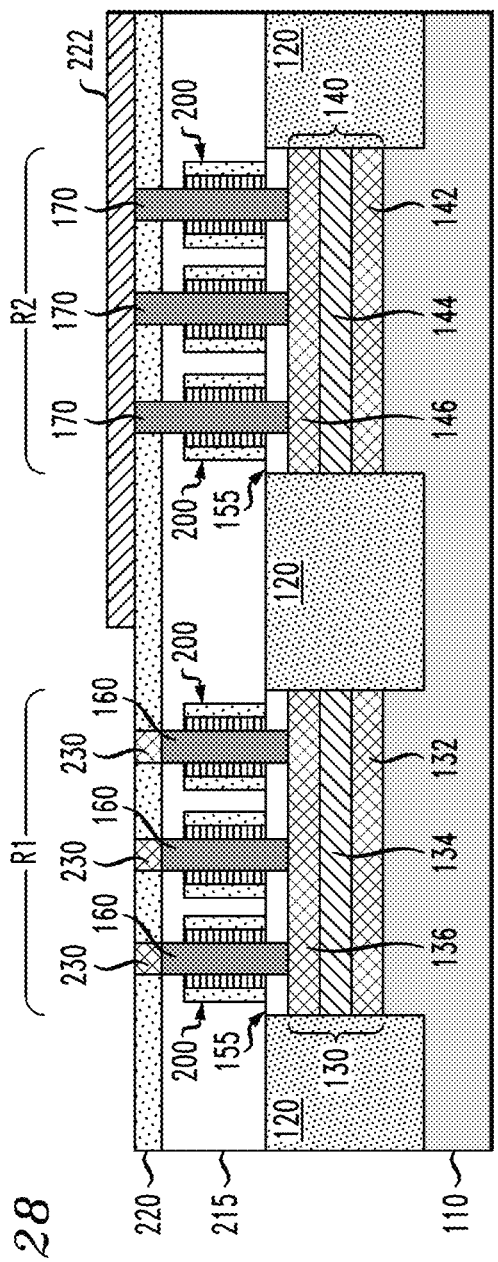

Next, FIG. 28 is a schematic cross-sectional side view of the semiconductor structure of FIG. 27 after forming source regions 230 on top of the vertical semiconductor fins 160 in the openings 220-1 in the ILD layer 220. The source regions 230 comprise epitaxial semiconductor material that is grown on top of the vertical semiconductor fins 160 using known techniques, such that the source regions 230 have the same crystal structure and orientation as the underlying epitaxial material of the vertical semiconductor fins 160. Depending on the type of vertical FETs that are being formed in the device regions R1, the source regions 230 can be formed of epitaxial Si, SiGe, SiC, or SiP materials, and doped with boron, phosphorus, or carbon.

For example, in one embodiment of the invention, the source regions 230 may comprise silicon-germanium structures that are epitaxially grown using known techniques such as CVD, MBE, or MOCVD, wherein SiH4 and GeH4 can be used as the sources for epitaxial growth of the SiGe source/drain structures. In another embodiment, the semiconductor source regions 230 may be formed by epitaxial growth of carbon-doped silicon (Si:C) using a Si containing gas such as $SiH_4$ and a carbon containing gas such as $CH_4$. In other embodiments, the epitaxial source regions 230 may be in-situ doped during epitaxial growth by adding a dopant gas to the source deposition gas (i.e., the Si-containing gas). Exemplary dopant gases may include a boron-containing gas such as $BH_3$ for p-type vertical FETs or a phosphorus or arsenic containing gas such as $PH_3$ or $AsH_3$ for n-type vertical FETs, wherein the concentration of impurity in the gas phase determines its concentration in the epitaxially grown source regions 230.

Figure 29:
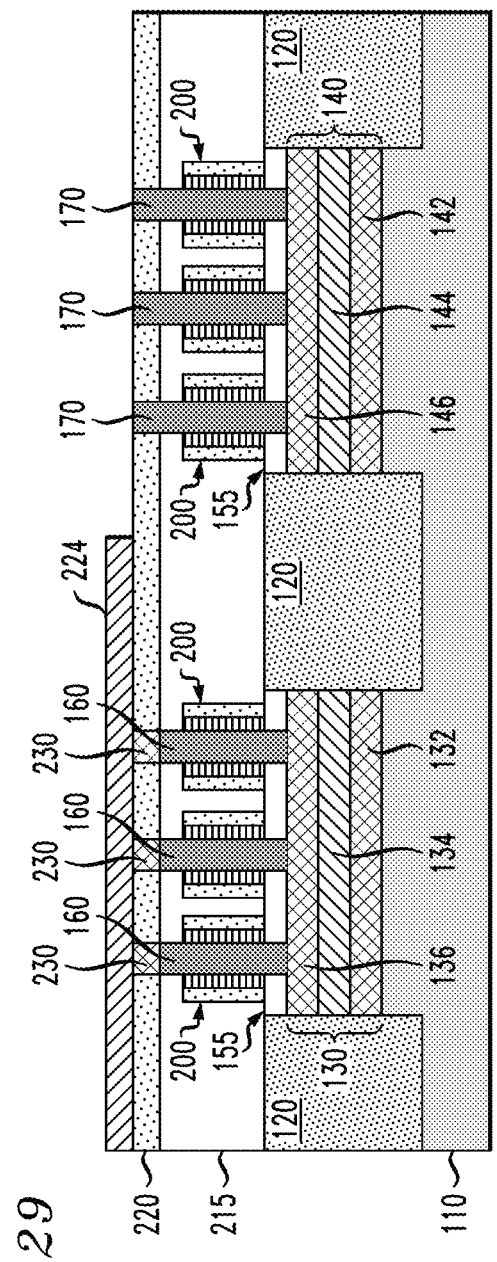

Following formation of the source regions 230, the remaining portion of the hardmask layer 222 is removed, and the process is repeated to form source regions in the device region R2. For example, FIG. 29 is a schematic cross-sectional side view of the semiconductor structure of FIG. 28 after removing the first hardmask 222, forming a second hardmask layer 224 over the ILD layer 220, and patterning the second hardmask layer 224 to expose portions of the ILD layer 220 in the device regions R2. The second hardmask layer 224 is formed by depositing layer of nitride material, such as SiN, or some other suitable material that can be etched selectively to the ILD layer 220.

Figure 30:
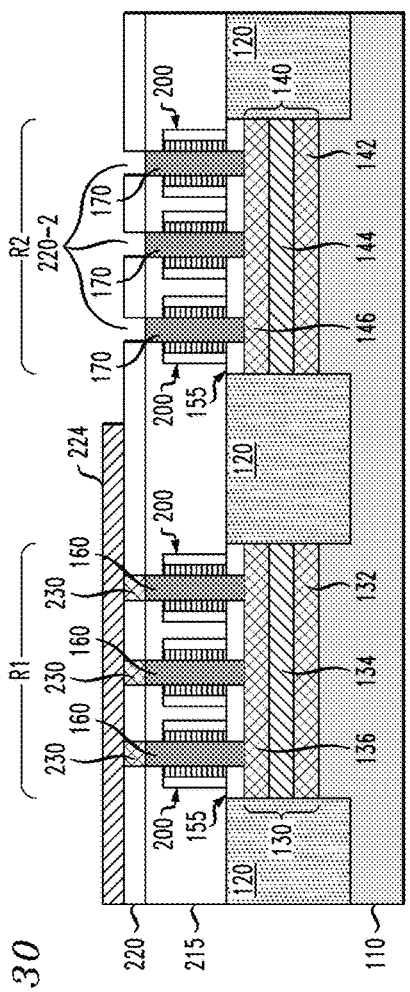

Next, FIG. 30 is a schematic cross-sectional side view of the semiconductor structure of FIG. 29 after etching down the upper portions of the vertical semiconductor fins 170 to form openings 220-2 in the ILD layer 220. In one embodiment, the vertical semiconductor fins 170 are recessed down to at least the level of the upper insulating spacer 215, for example, wherein the upper surface of vertical semiconductor fins 170 are approximately co-planar with the interface between the ILD layer 220 and the upper insulating spacer 215, as shown in example embodiment of FIG. 30.

Figure 31:
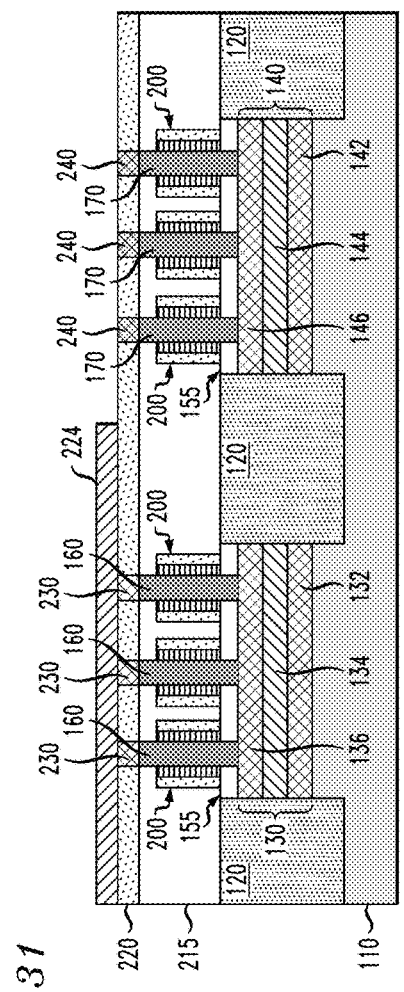

FIG. 31 is a schematic cross-sectional side view of the semiconductor structure of FIG. 30 after forming source regions 240 on top of the vertical semiconductor fins 170 in the openings 220-2 in the ILD layer 220. The source regions 240 comprise epitaxial semiconductor material that is grown on top of the vertical semiconductor fins 170 using known techniques, such that the source regions 240 have the same crystal structure and orientation as the underlying epitaxial material of the vertical semiconductor fins 170. Depending on the type of vertical FETs that are being formed in the device regions R2, the source regions 240 can be formed of epitaxial Si, SiGe, SiC, or SiP materials, and doped with boron, phosphorus, or carbon.

Figure 32A:
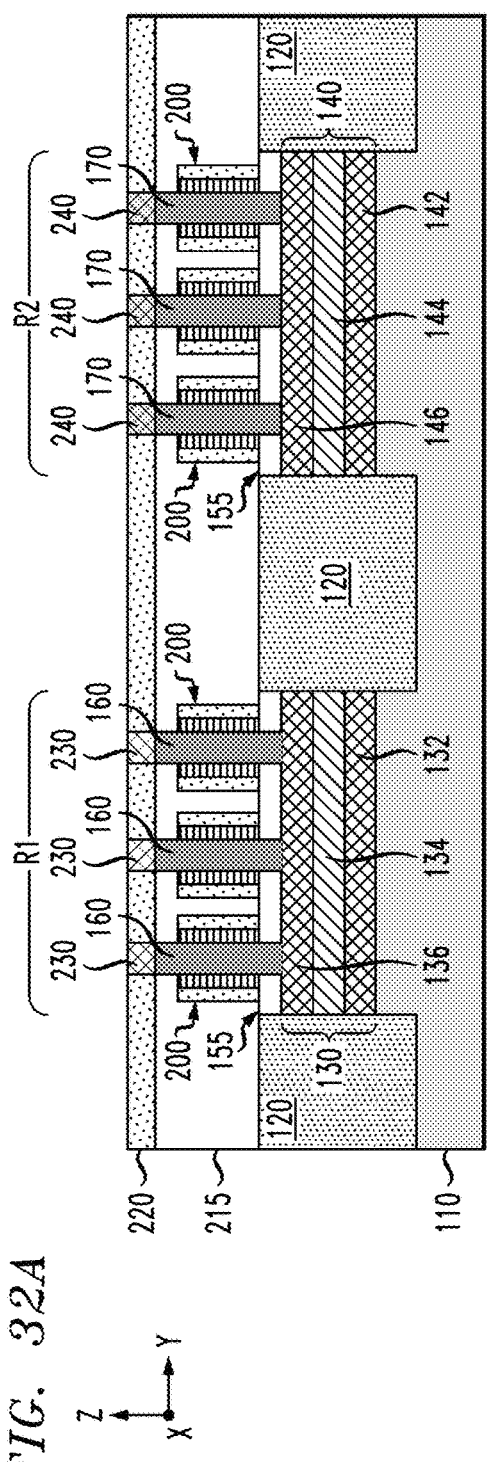
FIG. 32A is a schematic cross-sectional side view of the semiconductor structure of FIG. 31 after removing the second hardmask layer to expose the ILD layer and the source regions in the first and second device regions.
Figure 32B:
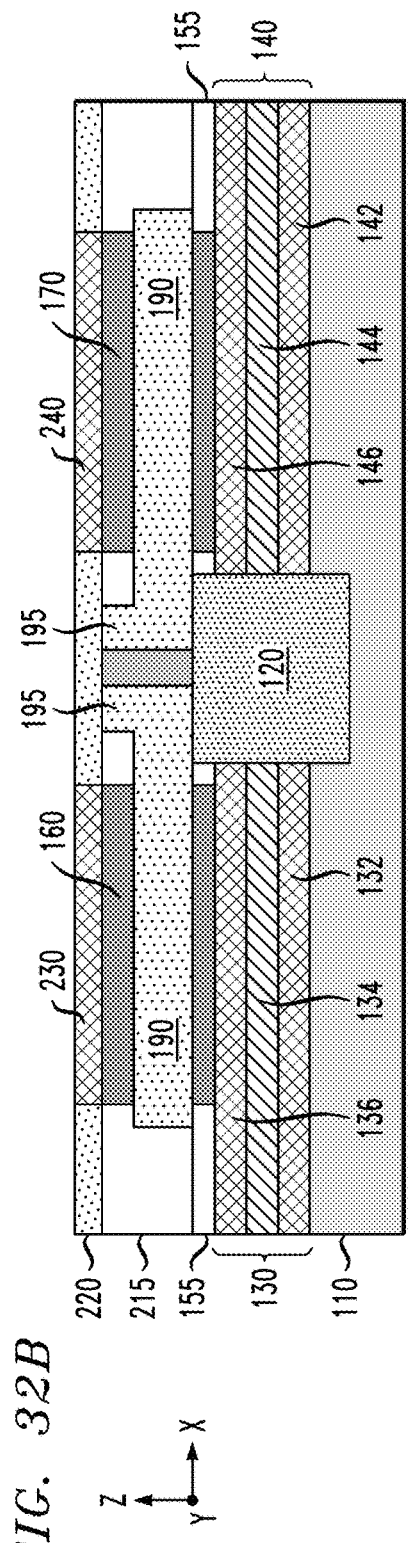
FIG. 32B is an exemplary side schematic view of the semiconductor structure of FIG. 32A from the perspective shown in FIG. 1A.

Following formation of the source regions, the second hardmask layer 224 is removed, resulting in the semiconductor structure shown in FIG. 32A. In particular, FIG. 32A is a schematic cross-sectional side view of the semiconductor structure of FIG. 31 after removing the second hardmask layer 224 to expose the ILD layer 220 and the source regions 230 and 240 in the device regions R1 and R2. Further, FIG. 32B is an exemplary side schematic view of the semiconductor structure of FIG. 32A within the X-Z plane (similar to the view of FIG. 1A). FIG. 32B shows an entire length of the vertical semiconductor fins 160/170 extending in the X direction in the device regions R1 and R2. As shown in FIG. 32B, the drain regions 130 and 140 extend underneath an entire length of the respective vertical semiconductor fins 160 and 170. One side of each of the drain regions 130 and 140 is disposed adjacent to the STI region 120 which isolates the device regions R1 and R2, while the opposing sides of the drain regions 130 and 140 extend past the ends of the vertical semiconductor fins 160 and 170 to provide sufficient area to enable formation of drain contacts to the respective drain regions 130 and 140, as explained in further detail below.

A next step in the illustrative fabrication process comprises forming metallic layers in the drain regions 130 and 140 and forming vertical drain contacts to the metallic layers in the drain regions 130 and 140 using a process flow as schematically illustrated in FIGS. 33-40. As an initial step, FIG. 33 is a schematic cross-sectional side view of the semiconductor structure of FIG. 32B after forming a capping layer 250 over the ILD layer 220. The capping layer 250 serves to protect the source regions 230 and 240 during subsequent process flows, and serves as an extension of the ILD layer 220. In one embodiment of the invention, the capping layer 250 is formed of the same material (e.g. oxide) as the ILD layer 220.

Next, FIG. 34 is a schematic cross-sectional side view of the semiconductor structure of FIG. 33 after depositing and patterning a hardmask layer 252 to form an etch mask having a pattern that is used to etch openings for drain contacts, according to an embodiment of the invention. The hardmask layer 252 can be formed of a material (e.g., silicon nitride) that allows the underlying layers to be etched selective to the hardmask layer 250. As shown in FIG. 34, the hardmask layer 252 comprises openings 252-1 that are aligned to the extended portions of the drain regions 130 and 140.

Figure 35:
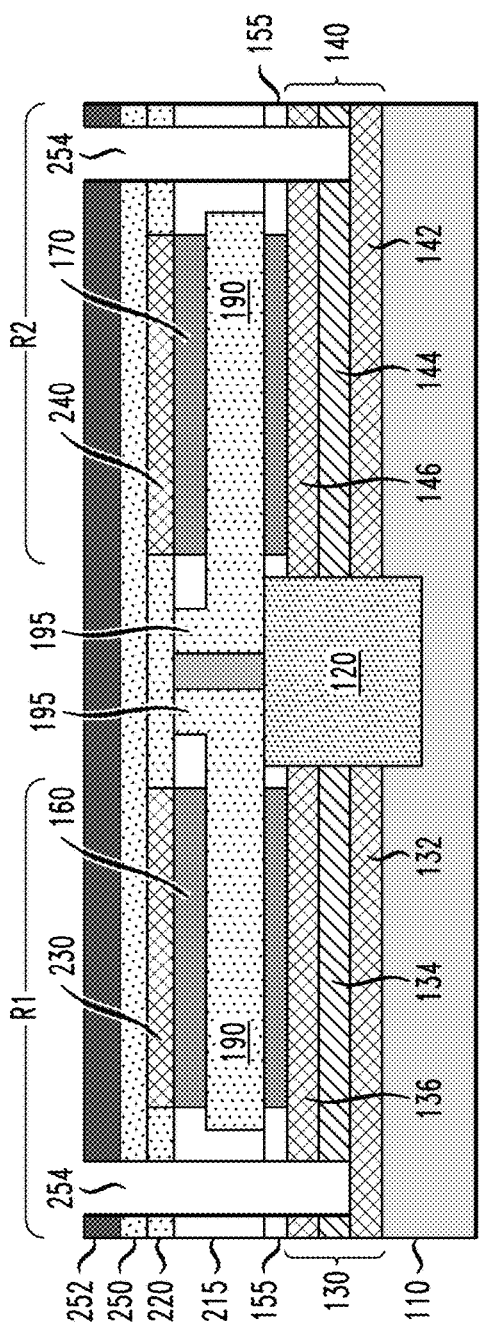

The hardmask layer 252 is used to etch openings through the underlying layers to expose the sacrificial epitaxial semiconductor layers 134 and 144 of the respective drain regions 130 and 140. For example, FIG. 35 is a schematic cross-sectional side view of the semiconductor structure of FIG. 34 after etching openings 254 through the underlying layers (250, 220, 215, 155, 136, 146) to expose the sacrificial epitaxial semiconductor layers 134 and 144 of the respective drain regions 130 and 140. The openings 254 can be etched using one or more directional RIE etch processes with etch chemistries suitable to etch the associated materials, or other suitable methods. As shown in FIG. 35, the openings 254 are etched to a depth that is sufficient to at least reach an upper surface of the sacrificial epitaxial semiconductor layers 134 and 144 of the respective drain regions 130 and 140.

Figure 36:
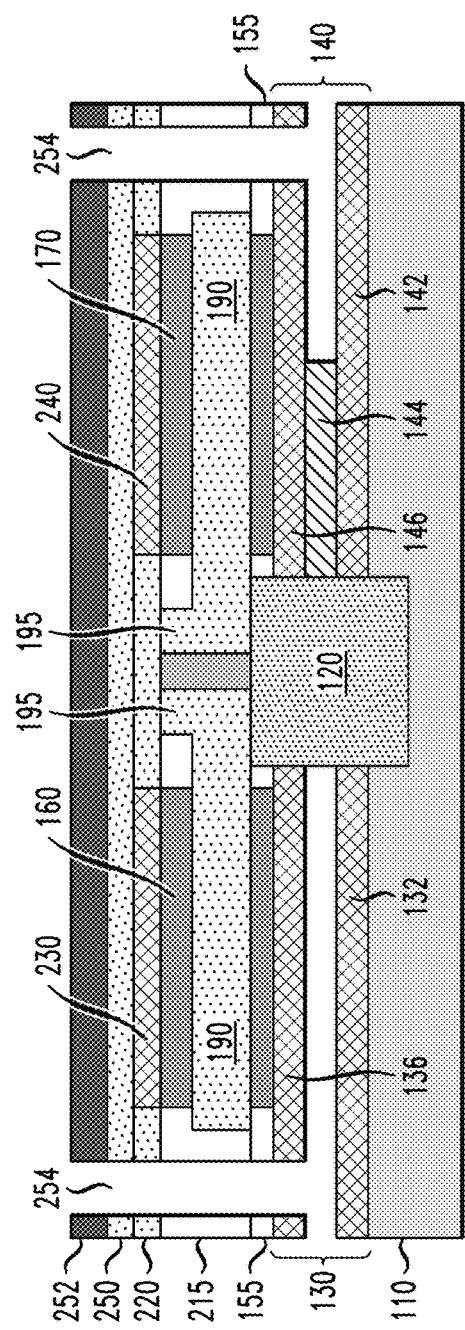

A next step in the illustrative process comprises removing all or at least a portion of the sacrificial epitaxial semiconductor layers 134 and 144 of the respective drain regions 130 and 140. For example, FIG. 36 is a schematic cross-sectional side view of the semiconductor structure of FIG. 35 after removing the entire sacrificial epitaxial semiconductor layer 134 of the drain region 130 and removing a portion of the sacrificial epitaxial semiconductor layer 144 of the drain region 140, thereby forming voids in the drain regions 130 and 140. The sacrificial epitaxial semiconductor layers 134 and 144 are removed or partially removed using an isotropic etch process (dry or wet etch) with an etch chemistry that etches the sacrificial epitaxial semiconductor layers 134 and 144 selective to the other epitaxial semiconductor layers 132/136 and 142/146 of the respective drain regions 130 and 140 so that such layers 132/136 and 142/146 are not removed. Moreover, the etching of the sacrificial epitaxial semiconductor layers 134 and 144 is performed selective to the materials of the underlying layers 250, 220, 215 and 155 to prevent lateral etching of the sidewalls of the openings 254. The selective etching of the sacrificial epitaxial semiconductor layers 134 and 144 is preferably performed with an etch rate ratio greater than about 10:1.

It is to be understood that for illustrative purposes, FIG. 36 shows an example of both full and partial removal of the sacrificial epitaxial semiconductor layers 134 and 144, respectively, of the drain regions 130 and 140. However, in other embodiments of the invention, the sacrificial epitaxial semiconductor layers of all drain regions (e.g., drain regions 130 and 140) can be fully removed, or the sacrificial epitaxial semiconductor layers of all drain regions can be partially removed.

Figure 37:
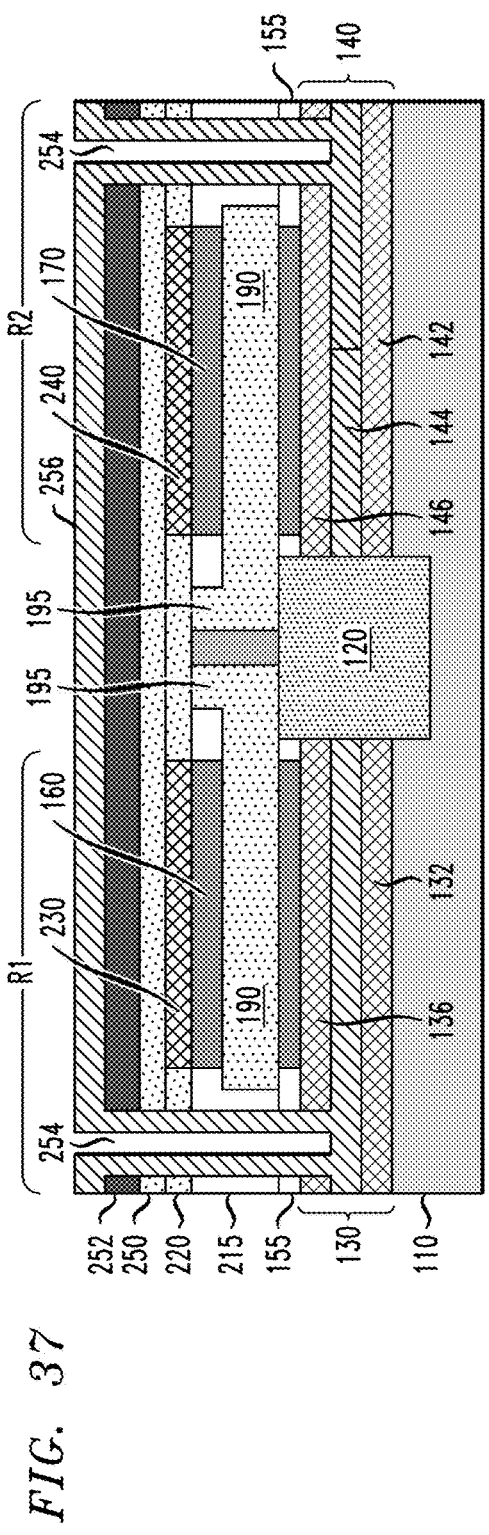

Following the removal (or partial removal) of the sacrificial epitaxial semiconductor layers 134 and 144 of the respective drain regions 130 and 140, the voids in the drain regions 130 and 140 regions are filled with a metallic material, which is used to combine with at least a portion of the remaining epitaxial semiconductor layers of the drain regions 130 and 140 to form metallic-semiconductor alloy regions within the drain regions 130 and 140. In particular, as an initial step, FIG. 37 is a schematic cross-sectional side view of the semiconductor structure of FIG. 36 after depositing a layer of metallic material 256 to fill the voids in the drain regions 130 and 140 with the metallic material. The layer of metallic material 256 is conformally deposited on the exposed surfaces of the semiconductor structure using ALD or other suitable deposition methods (e.g., PVD, CVD, etc.). The layer of metallic material 256 can include a transition metal such as nickel (Ni), cobalt (Co), titanium (Ti), platinum (Pt), tungsten (W), tantalum (Ta), an alloy such as TiAl or TiN, etc., or any other suitable metallic material. Prior to deposition of the layer of metallic material 256, a preclean process can be performed to remove any surface impurities or oxides from the exposed surfaces of the epitaxial semiconductor layers of the drain regions 130 and 140.

Figure 38:
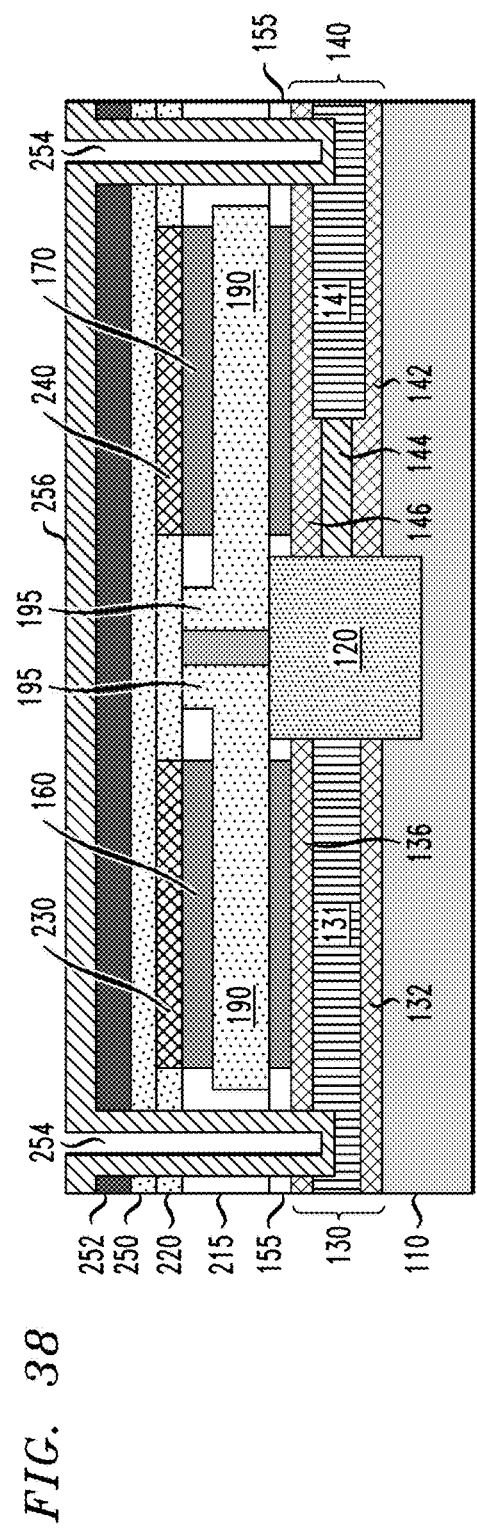

Following deposition of the layer of metallic material 256, a thermal anneal process is performed at an appropriate temperature to induce a reaction between the epitaxial semiconductor material of the drain regions 130 and 140 and the metallic material 256 within the voids to form the metal-semiconductor alloy regions 131 and 141 within the respective drain regions 130 and 140. For example, FIG. 38 is a schematic cross-sectional side view of the semiconductor structure of FIG. 37 after forming the metal-semiconductor alloy regions 131 and 131 within the respective drain regions 130 and 140. Within the drain region 130, the metallic material 256 reacts with the at least a portion of the semiconductor material of the first and third epitaxial semiconductor layers 132 and 136 to form the metal-semiconductor alloy region 131. In addition, within the drain region 140, the metallic material 256 reacts with at least a portion of the semiconductor material of the first, second and third epitaxial semiconductor layers 132, 134, and 136 to form the metal-semiconductor alloy region 141.

In one embodiment, when the epitaxial semiconductor layers of the drain regions 130 and 140 are formed with Si, the metal-semiconductor alloy regions 131 and 141 comprise metal silicide regions. In other embodiments, when the epitaxial semiconductor layers of the drain regions 130 and 140 are formed of semiconductor materials (e.g., III-V semiconductor compounds) other than Si, other types of metal-semiconductor alloy regions can be formed (e.g., Ni with InGaAs, etc.).

Figure 39:
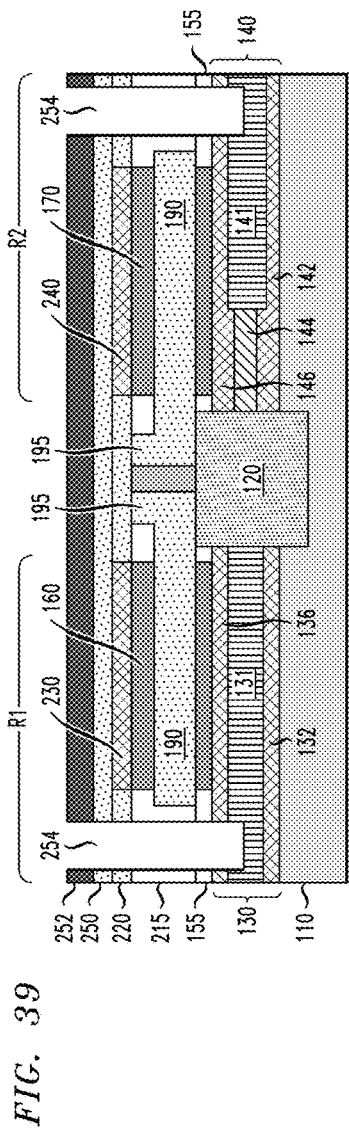

During the thermal anneal process, the metallic material 256 does not react with the insulating materials (e.g., layers 250, 220, 215, 155) that are in contact with the layer of metallic material 256, such that a portion of the layer of metallic material 256 remains on the sidewalls of the vias 254 and on top of the etch hardmask layer 250 after the metal-semiconductor alloy regions 131 and 141 are formed, as shown in FIG. 38. Following the formation of the metal-semiconductor alloy regions 131 and 141, the remaining metallic material 256 is removed, followed by removal of the etch hardmask layer 252. In particular, FIG. 39 is a schematic cross-sectional side view of the semiconductor structure of FIG. 38 after removing the remaining metallic material 256 and etch hardmask layer 252. The remaining metallic material 256 is removed by chemical etching, leaving the metal-semiconductor alloy regions 131 and 141 within the respective drain regions 130 and 140. For example, the unreacted portion of the metallic material 256 can be removed using a wet etch process that removes the remaining metallic material 256 selective to the metal semiconductor alloy regions 131/141. Moreover, the etch hardmask layer 252 can be removed with a wet etch process that is selective to the underlying capping layer 250 and the sidewall surfaces of the vias 254, and which does not etch or otherwise damage the exposed surfaces of the metal semiconductor alloy regions 131/141.

Figure 40:
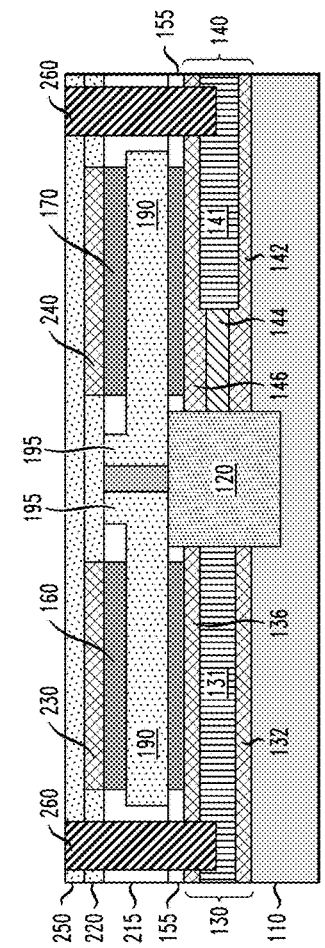

A next step in the process flow comprises filling the openings 254 with conductive material to form vertical drain contacts to the drain regions 130 and 140. For example, FIG. 40 is a schematic cross-sectional side view of the semiconductor structure of FIG. 39 after forming vertical drain contacts 260 in the openings 254, which make contact to the metal-semiconductor alloy regions 131 and 141 of the respective drain regions 130 and 140. In one embodiment of the invention, the drain contacts 260 are formed by depositing one or more layers of liner and metallic material over the semiconductor structure of FIG. 39 to fill the openings 254, followed by a CMP process to remove the overburden liner and metallic material on the surface of the capping layer 250. For example, the openings 254 can be lined with a thin conformal barrier diffusion layer (e.g., TiN or TaN, etc.), and then filled with a conductive material including, but not limited to, copper, tungsten, cobalt, aluminum, or other conductive materials that are suitable for use in forming drain contacts.

In an alternate embodiment of the invention, following the removal (or partial removal) of the sacrificial epitaxial semiconductor layers 134 and 144 of the respective drain regions 130 and 140, the voids in the drain regions 130 and 140 and the contact openings 254 can be filled with conductive material with no subsequent anneal. For example, a metallic material can be deposited to fill the voids in the drain regions 130 and 140 and the contact openings 254, thereby forming metallic layers within the drain regions 130 and 150 and the vertical drain contacts 260 with the same metallic material as deposited with a single deposition process (with no subsequent anneal to form metal-semiconductor alloy regions in the drain regions 130 and 140). In yet another embodiment of the invention, a thin layer of liner material can first be deposited to line the exposed surfaces of the epitaxial semiconductor material within the voids in the drain regions 130 and 140 regions and to line the contact openings 254, wherein the liner material serves to provide a lower contact resistance to the epitaxial semiconductor materials of the drain regions 130 and 140. Following deposition of the liner material, the voids in the drain regions 130 and 140 and the contact openings 254 are then filled with a bulk metallic filler material which has a lower bulk resistance than the liner material (again with no subsequent anneal).

Figure 41:
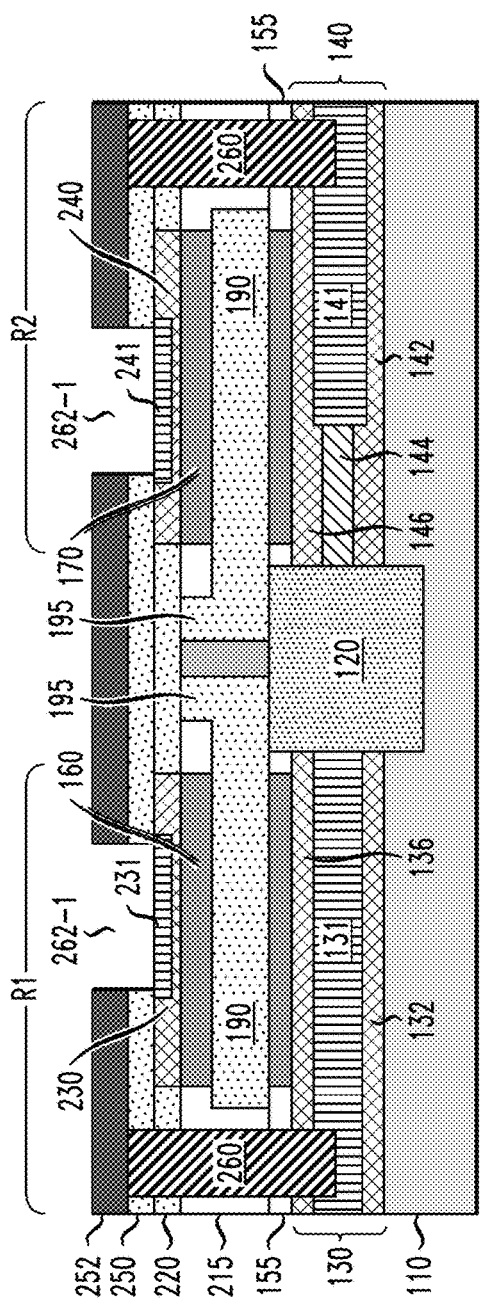
Figure 42:
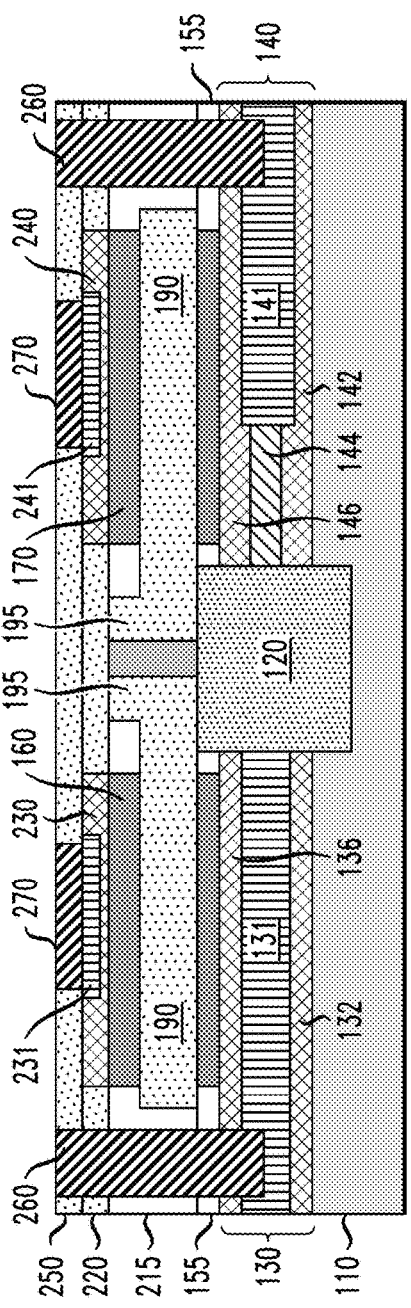

After forming the drain contacts, 260, the fabrication process continues with forming vertical source contacts using a process flow as schematically illustrated in FIGS. 41 and 42. For example, FIG. 41 is a schematic cross-sectional side view of the semiconductor structure of FIG. 40 after forming metal-semiconductor alloy regions 231 and 241 (e.g., silicide) on the respective source regions 230 and 240. In addition, FIG. 42 is a schematic cross-sectional side view of the semiconductor structure of FIG. 41 after forming source contacts 270 to the metal-semiconductor alloy regions 231 and 241 on the respective source regions 230 and 240. The source contacts 270 can be fabricated using a process flow similar to the process flow for forming the drain contacts 260, as discussed above.

For example, as shown in FIG. 41, a layer of insulting material (e.g., silicon nitride) is deposited and patterned to form an etch hardmask layer 262 having a pattern of openings 262-1 which are aligned to, and expose portions of, the source regions 230 and 240 of all vertical semiconductor fins 160 and 170 in the device regions R1 and R2. The hardmask layer 262 is used to etch openings through the capping layer 250 (via RIE) to expose the portions of the underlying source regions 230 and 240. The metal-semiconductor alloy regions 231 and 241 are formed by depositing a conformal layer of metallic material over the surface of the semiconductor structure to cover the exposed portions of the source regions 231 and 241 with metallic material A thermal anneal process is then performed at an appropriate temperature to induce reaction of the epitaxial semiconductor material of the source regions 230 and 240 and the metallic material to form the metal-semiconductor alloy regions 231 and 241 of the respective source regions 230 and 240.

Following the formation of the metal-semiconductor alloy regions 231 and 241, the unreacted metallic material and etch hardmask layer 262 are etched away from the surface of the semiconductor structure using suitable wet etch chemistries. Next, the source contacts 270 shown in FIG. 42 are formed by depositing one or more layers of liner and metallic material over the semiconductor structure to fill the openings in the capping layer 250, followed by a CMP process to remove the overburden liner and metallic material and etch hardmask layer 262 down to the surface of the capping layer 250, resulting in the structure shown in FIG. 42. The source contacts 270 can be formed using the same or similar liner and conductive materials as noted above to form the drain contacts 260.

After forming the source contacts 270, the fabrication process continues with forming gate contacts 280 resulting in the structure shown in FIG. 1A. The gate contacts 280 can be formed by etching openings in the capping layer 250 and ILD layer 220 to expose the extended portions 192 of all the gate electrodes 190 in the device regions R1 and R2, depositing one or more layers of liner and metallic material to fill the openings, and planarizing the surface of the semiconductor structure (via CMP) remove the overburden liner and metallic material on the surface of the capping layer 250, resulting in the gate contacts 280 shown in FIG. 1A.

As discussed above, FIG. 1B shows an example embodiment in which the drain contacts 260 in the device regions R1 and R2 are formed on one side of the drain region 130 adjacent to one end of the vertical semiconductor fins 160 and 170. In other embodiments of the invention, the drain contacts can be formed in a variety of different arrangements for purposes of, e.g., facilitating removal of the sacrificial epitaxial semiconductor layers in the drain regions 130 and 140 and/or to further reduce the external drain resistance, and/or increasing Vds uniformity over the drain regions 130 and 140, etc. Alternate embodiments for forming drain contacts with different layouts in a device region are shown in FIGS. 43~49.

Figure 43:
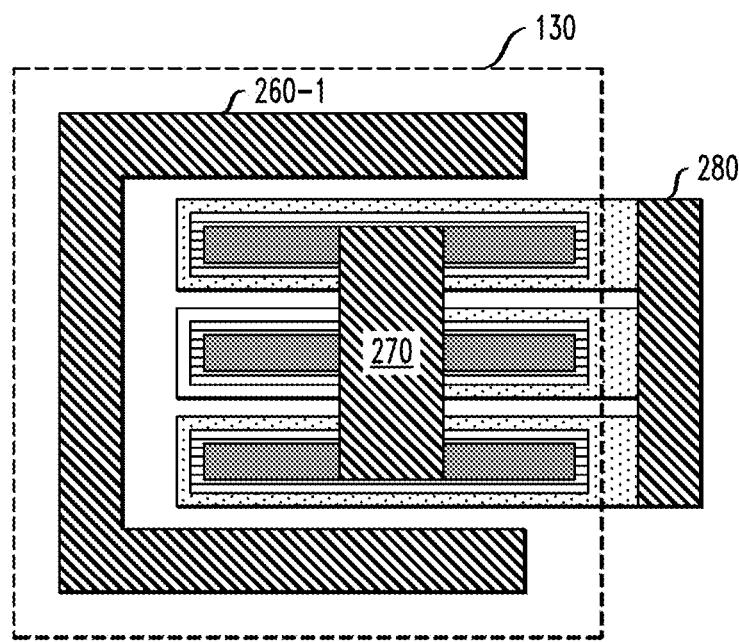
FIG. 43 is a top plan view of a device region showing a layout of drain contacts according to another embodiment of the invention.

For example, FIG. 43 is a top plan view of a device region showing a layout of drain contacts according to another embodiment of the invention. The layout shown in FIG. 43 is similar to the layout shown in FIG. 1B for the device region R1, except that the layout of FIG. 43 includes a continuous elongated drain contact 260-1 that is formed to contact to three sides of the drain region 130.

Figure 44:
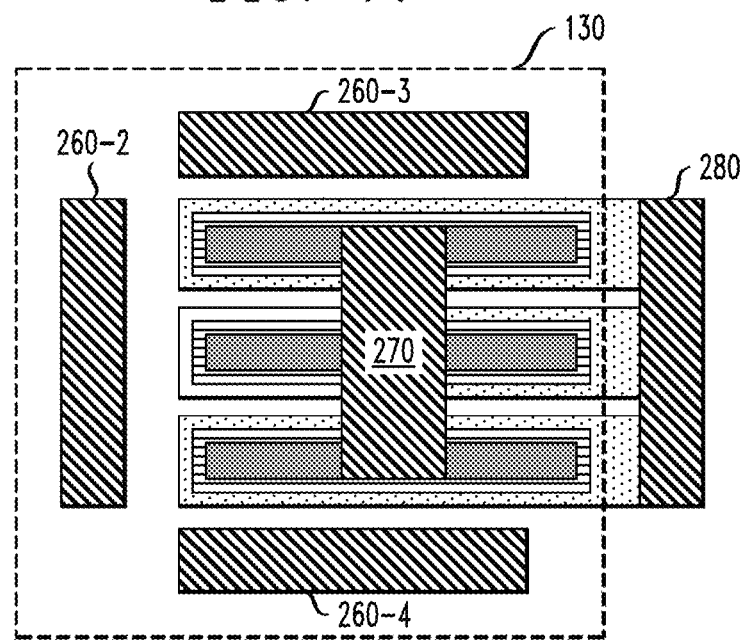
FIG. 44 is a top plan view of a device region showing a layout of drain contacts according to another embodiment of the invention.

FIG. 44 is a top plan view of a device region showing a layout of drain contacts according to another embodiment of the invention. The layout shown in FIG. 44 is similar to the layout shown in FIG. 43 except that the layout of FIG. 44 includes three separate elongated drain contacts 260-2, 260-3, and 260-4 that are disposed on three separate sides of the drain region 130.

Figure 45:
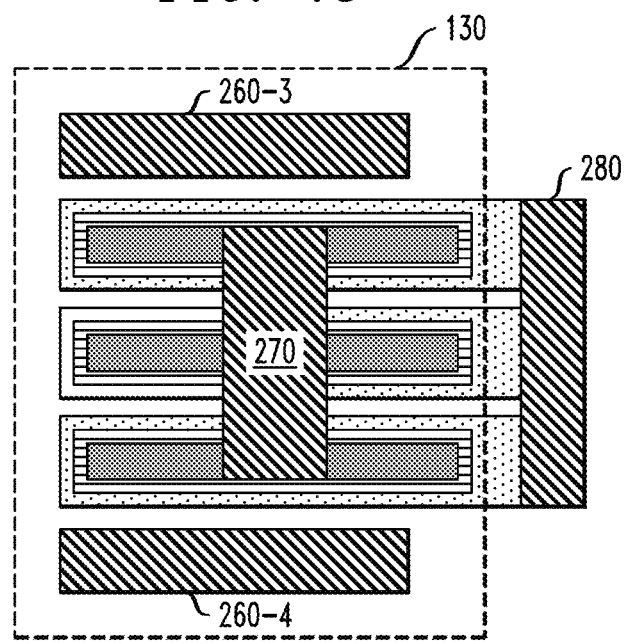
FIG. 45 is a top plan view of a device region showing a layout of drain contacts according to another embodiment of the invention.

FIG. 45 is a top plan view of a device region showing a layout of drain contacts according to another embodiment of the invention. The layout shown in FIG. 45 is similar to the layout shown in FIG. 44 except that the layout of FIG. 45 includes the two separate elongated drain contacts 260-3 and 260-4 that are formed on two opposing sides of the drain region 130 (while omitting the elongated drain contact 260-2).

Figure 46:
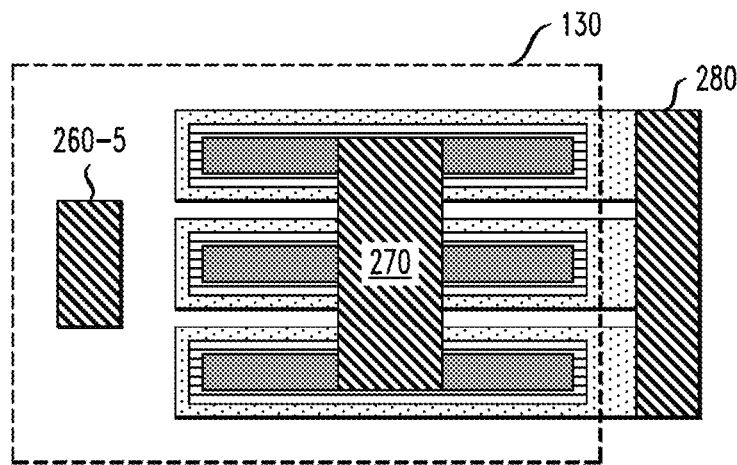
FIG. 46 is a top plan view of a device region showing a layout of drain contacts according to another embodiment of the invention.

FIG. 46 is a top plan view of a device region showing a layout of drain contacts according to another embodiment of the invention. The layout shown in FIG. 46 is similar to the layout shown in FIG. 1B in that the layout shown in FIG. 46 includes one elongated drain contact 260-5 which is formed to contact one side of the drain region 130, but which is shorter in length (or smaller in cross sectional area) than the elongated drain contact 260 of FIG. 1B.

Figure 47:
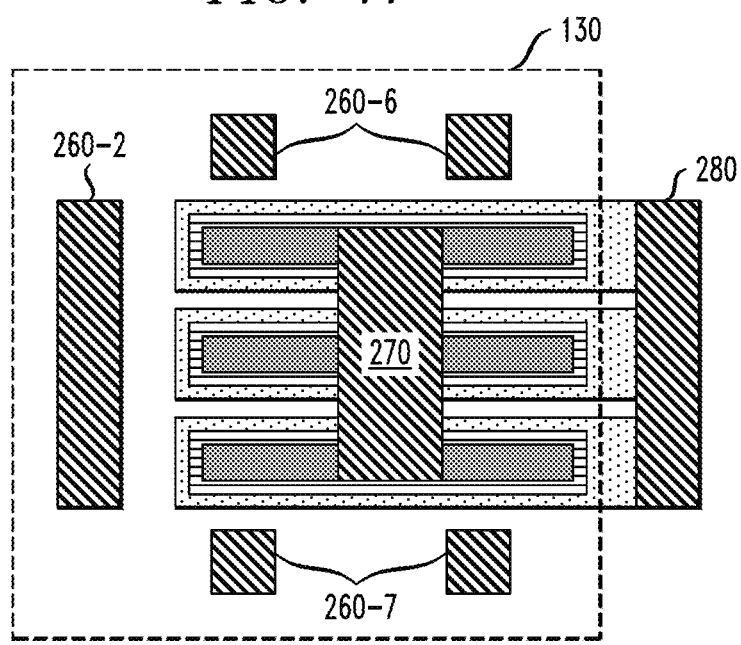
FIG. 47 is a top plan view of a device region showing a layout of drain contacts according to another embodiment of the invention.

FIG. 47 is a top plan view of a device region showing a layout of drain contacts according to another embodiment of the invention. The layout shown in FIG. 47 is similar to the layout shown in FIG. 44 in that the layout shown in FIG. 47 includes one elongated drain contact 260-2 disposed adjacent to the ends of the vertical semiconductor fins 160, and which is formed to contact one side of the drain region 130. The layout shown in 47 comprises smaller drain contacts 260-6 and 260-7 on the other sides of the drain region 130 (as opposed to the elongated drain contacts 260-3 and 260-4 shown in FIG. 44).

Figure 48:
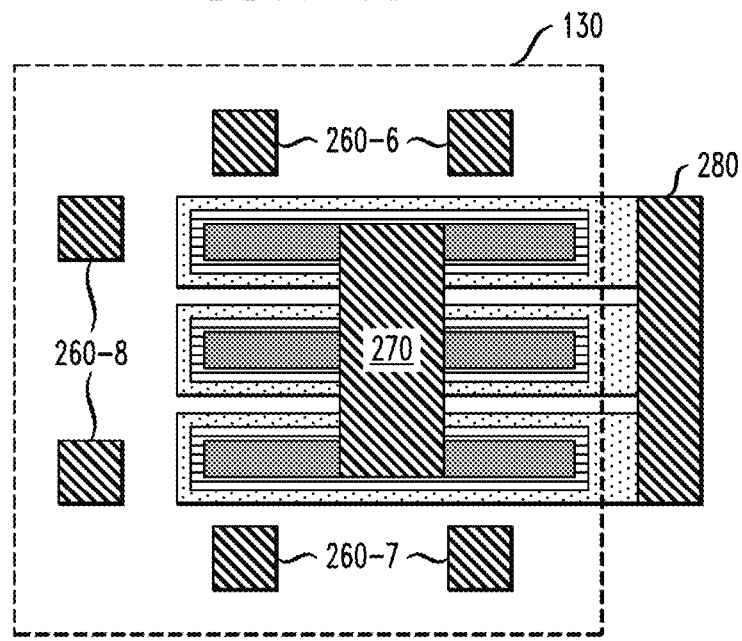
FIG. 48 is a top plan view of a device region showing a layout of drain contacts according to another embodiment of the invention.

FIG. 48 is a top plan view of a device region showing a layout of drain contacts according to another embodiment of the invention. The layout shown in FIG. 48 is similar to the layout shown in FIG. 47 in that the layout shown in FIG. 48 includes the smaller drain contacts 260-6 and 260-7 on opposing sides of the drain region 130. However, the layout in FIG. 48 includes several smaller drain contacts 260-8 disposed in the region adjacent to the ends of the vertical semiconductor fins (as opposed to one elongated drain contact 260-2 shown in FIG. 47).

Figure 49:
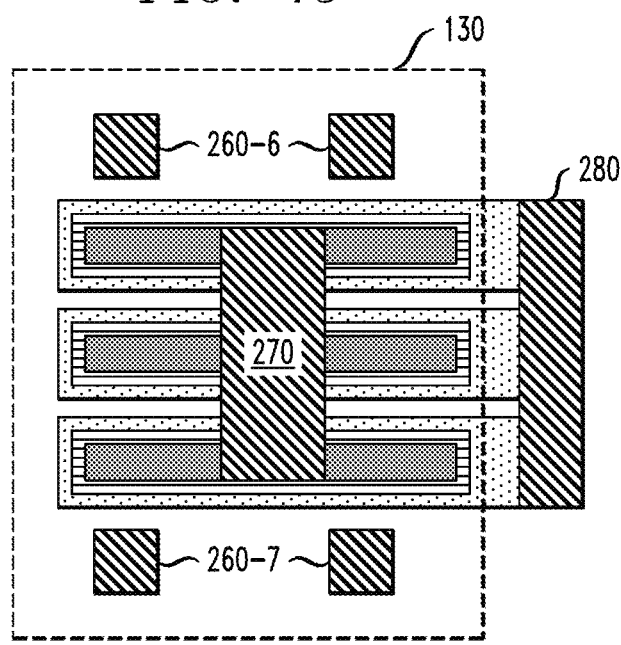
FIG. 49 is a top plan view of a device region showing a layout of drain contacts according to another embodiment of the invention.

FIG. 49 is a top plan view of a device region showing a layout of drain contacts according to another embodiment of the invention. The layout shown in FIG. 49 is similar to the layout shown in FIG. 48, expect the layout in FIG. 49 does not include several smaller drain contacts 260-8 disposed in the region adjacent to the ends of the vertical semiconductor fins.

The different layouts/arrangements of drain contacts shown in FIGS. 43-49 can be utilized as necessary to facilitate formation of metallic regions within the drain regions and to obtain desired performance characteristics. For example, in circumstances where the vertical semiconductor fins for the given device region are relatively long, the drain contact layouts shown in FIG. 43, 44, 45, 47, 48 or 49 can be used to ensure that the sacrificial epitaxial material in the drain region can be removed and adequately filled with metallic material to form the metal-semiconductor alloy region of the drain region. Indeed, if the drain contact layouts shown in FIGS. 1B and 46 were used, it may be difficult to form the metallic drain regions over the entire length of the drain region in circumstances where the drain contacts were only formed adjacent to the end potion of relatively long vertical semiconductor fins.

Similarly, in circumstances where the given device region comprises a large number of parallel disposed vertical semiconductor fins, the layouts shown in FIGS. 45 and 49, for example, could be utilized to ensure that the sacrificial epitaxial material in the drain region can be removed and adequately filled with metallic material to form the metal-semiconductor alloy region of the drain region. Moreover, the example layouts shown in FIGS. 47, 48 and 49, for example, which have a number of smaller drain contacts disposed around the outer peripheral area of the drain region, can be utilized to ensure proper formation of metallic regions within the drain region, while achieving lower parasitic capacitances due to the smaller size drain contacts, and increased Vds uniformity over the drain region.

It is to be understood that the methods discussed herein for fabricating vertical semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor device, comprising:
   a first source/drain region formed on a semiconductor substrate, wherein the first source/drain region comprises a metallic layer and at least a first epitaxial semiconductor layer;
   a vertical semiconductor fin formed on the first source/drain region;
   a second source/drain region formed on an upper surface of the vertical semiconductor fin;
   a gate structure formed on a sidewall surface of the vertical semiconductor fin;
   a layer of insulating material encapsulating the vertical semiconductor fin and the gate structure; and
   a first vertical contact formed through the layer of insulating material and in contact with the metallic layer of the first source/drain region, wherein the first vertical contact and the metallic layer of the first source/drain region are formed of a same metallic material.

2. The semiconductor device of claim 1, wherein the metallic layer of the first source/drain region extends along an entire length of the vertical semiconductor fin.

3. The semiconductor device of claim 1, wherein the metallic layer comprises at least one of copper, tungsten, cobalt, and aluminum.

4. The semiconductor device of claim 1, wherein the first source/drain region comprises a second epitaxial semiconductor layer, wherein the metallic layer is disposed between the first and second epitaxial semiconductor layers.

5. The semiconductor device of claim 1, wherein the vertical semiconductor fin comprises an epitaxial semiconductor material that is epitaxially grown on the first epitaxial semiconductor layer of the first source/drain region.

6. The semiconductor device of claim 1, further comprising a second vertical contact formed through the layer of insulating material, which is formed of the same metallic material as the metallic layer of the first source/drain region, wherein the first vertical contact is disposed adjacent to an end of the vertical semiconductor fin, and wherein the second vertical contact is disposed adjacent to a first sidewall of the vertical semiconductor fin.

7. The semiconductor device of claim 6, further comprising a third vertical contact formed through the layer of insulating material, which is formed of the same metallic material as the metallic layer of the first source/drain region, wherein the third vertical contact is disposed adjacent to a second sidewall of the vertical semiconductor fin, which is opposite the first sidewall of the vertical semiconductor fin.

8. A method for fabricating a semiconductor device, comprising:

forming a first source/drain region on a semiconductor substrate, wherein the first source/drain region comprises a first epitaxial semiconductor layer and a sacrificial epitaxial semiconductor layer;

forming a vertical semiconductor fin on the first source/drain region;

forming, a gate structure on a sidewall surface of the vertical semiconductor fin;

encapsulating the vertical semiconductor fin and the gate structure in insulating, material;

forming a second source/drain region on an upper surface of the vertical semiconductor fin;

forming an opening through the insulating material and into the first source/drain region to expose the sacrificial epitaxial semiconductor layer of the first source/drain region;

removing at least a portion of the sacrificial epitaxial semiconductor layer through the opening in the insulating material to form a void in the first source/drain region; and filling the void in the first source/drain region and the opening in the insulating material with a same metallic material to form a first vertical contact which vertically extends through the insulating material.

9. The method of claim 8, wherein forming the first source/drain region on the semiconductor substrate comprises forming a heteroepitaxial stack structure comprising the sacrificial epitaxial semiconductor layer disposed between the first epitaxial semiconductor layer and a second semiconductor epitaxial layer.

10. The method of claim 8, wherein forming a vertical semiconductor fin on the first source/drain region comprises epitaxially growing the vertical semiconductor fin on the first epitaxial semiconductor layer of the first source/drain region.

11. The method of claim 8, wherein removing at least a portion of the sacrificial epitaxial semiconductor layer to form a void in the first source/drain region comprises etching the sacrificial epitaxial semiconductor layer selective to the first epitaxial semiconductor layer.

12. The method of claim 8, wherein filling the void in the first source/drain region and the opening in the insulating material with the metallic material comprises performing a single metal deposition process to concurrently fill the void and the opening with the same metallic material.

13. The method of claim 12, wherein the metallic material comprises at least one of copper, tungsten, cobalt, and aluminum.

14. The method of claim 8, wherein forming an opening through the insulating material comprises forming two or more openings through the insulating material and into the first source/drain region to expose the sacrificial epitaxial semiconductor layer of the first source/drain region; and wherein filling the opening with the metallic material comprises filling, the two or more openings with the metallic material to form the first vertical contact and at least a second vertical in the insulating material, wherein the first vertical contact is disposed adjacent to an end of the vertical semiconductor fin, and wherein the second vertical contact is disposed adjacent to a sidewall of the vertical semiconductor fin.

* * * * *